United States Patent
Tsuda et al.

(10) Patent No.: US 6,614,824 B2
(45) Date of Patent: Sep. 2, 2003

(54) NITRIDE SEMICONDUCTOR LASER DEVICE AND OPTICAL DEVICE USING THE SAME

(75) Inventors: Yuhzoh Tsuda, Tenri (JP); Shigetoshi Ito, Ikoma (JP); Toshiyuki Okumura, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/950,576

(22) Filed: Sep. 13, 2001

(65) Prior Publication Data

US 2002/0054617 A1 May 9, 2002

(30) Foreign Application Priority Data

Sep. 14, 2000 (JP) ........................................ 2000-279207

(51) Int. Cl.[7] .................................................. H01S 5/00
(52) U.S. Cl. ............................. 372/46; 372/45; 372/34
(58) Field of Search .............................. 372/46, 45, 43, 372/34

(56) References Cited

U.S. PATENT DOCUMENTS

| | | | | |
|---|---|---|---|---|
| 5,953,357 A | * | 9/1999 | Hirata et al. ................. | 372/45 |
| 6,324,200 B1 | * | 11/2001 | Kamiyama et al. ........... | 372/43 |
| 6,345,064 B1 | * | 2/2002 | Fujii ............................ | 372/46 |
| 6,370,176 B1 | * | 4/2002 | Okumura ..................... | 372/45 |

FOREIGN PATENT DOCUMENTS

| | | |
|---|---|---|
| JP | A10261838 | 9/1998 |
| JP | A10270804 | 10/1998 |
| JP | A11214788 | 8/1999 |

OTHER PUBLICATIONS

IEICE Trans. Electron., vol. E83–C, No. 4 Apr. 2000 pp. 529–535.

* cited by examiner

*Primary Examiner*—Paul Ip
*Assistant Examiner*—Dung T. Nguyen
(74) *Attorney, Agent, or Firm*—Birch, Stewart, Kolasch & Birch, LLP

(57) ABSTRACT

A nitride semiconductor laser device having a low threshold current and low noise is provided. The laser device includes n-type and p-type layers made of nitride semiconductor and formed on a substrate, and a light emitting layer between the n-type and p-type layers. The light emitting layer is formed of a well layer or a combination of well and barrier layers. At least the well layer is made of nitride semiconductor containing element X, N and Ga, wherein element is at least one selected from the group consisting of As, P and Sb. The atomic fraction of element X is smaller than that of N. A maximum width through which current is injected into the light emitting layer via the p-type layer is from 1.0 $\mu$m to 4.0 $\mu$m.

12 Claims, 12 Drawing Sheets

<1-100> AZIMUTH

<1-100> AZIMUTH

CROSS-SECTIONAL VIEW ILLUSTRATING
A SEMICONDUCTOR LASER DEVICE

CROSS-SECTIONAL VIEW ILLUSTRATING
A SEMICONDUCTOR LASER DEVICE

NITRIDE SEMICONDUCTOR LASER
DEVICE AND OPTICAL DEVICE USING THE
SAME

BACKGROUND OF THE INVENTION

FIELD OF THE INVENTION

The present invention relates to a nitride semiconductor laser device having a low lasing threshold current and excellent noise characteristics, and relates to an optical device using the nitride semiconductor laser device.

DESCRIPTION OF THE BACKGROUND ART

A nitride semiconductor laser device having a light emitting layer of InGaN crystal is reported in IEICE TRANS. ELECTRON., Vol. E83-C, No. 4, April 2000, pp. 529–535.

Japanese Patent Laying-Open No. 10-270804 discloses a nitride semiconductor device having a light emitting layer formed of GaNAs, GaNP or GaNSb crystal.

Japanese Patent Laying-Open No. 10-261838 discloses a gallium nitride based semiconductor light-emitting device having a quantum well active layer sandwiched between nitride semiconductor cladding layers and/or guiding layers. The quantum well active layer, which has a layered structure consisting of well and barrier layers, is formed of nitride semiconductor containing at least indium and gallium, specifically InGaN. The number of well layers is 2 to 4 and the thickness of the barrier layer is 4 nm or less. It is also disclosed that the light-emitting device with the structure as described above has a ridge structure with a stripe width of 1 to 5 $\mu$m.

Japanese Patent Laying-Open No. 11-214788 discloses a gallium nitride based semiconductor laser device having an active layer sandwiched between nitride semiconductor cladding layers and/or guiding layers. The active layer is formed of nitride semiconductor, current is injected into a stripe region with its width smaller than that of the active layer. The width of the stripe is 0.2 to 1.8 $\mu$m. Regarding the material of the active layer, the following description is found in this document. "The active layer having a multiple quantum well structure consists of two quantum well layers of $In_{0.2}Ga_{0.8}N$ and one barrier layer of $In_{0.05}Ga_{0.95}N$. The respective compositions are set depending on the required laser emission wavelength. The In ratio of the quantum well layer may be increased for attaining a longer emission wavelength while that may be decreased for attaining a shorter emission wavelength. The quantum well and barrier layers may be formed of mixed crystal semiconductor of four or more element mixed crystal that is based on InGaN to which a slight amount of another element is added. The barrier layer may be of GaN only." However, this document shows nothing about specific elements except for In, Ga and N to be used for the active layer. Moreover, the width of the stripe region defined by this prior art is only applied to the active layer of InGaN.

In the conventional nitride semiconductor laser device with the light emitting layer of InGaN crystal, the electrons and holes in the semiconductor material of the light emitting layer have considerably great effective mass. Therefore, the lasing threshold current can only be reduced to a limited extent.

On the other hand, the nitride semiconductor laser disclosed in Japanese Patent Laying-Open No. 10-270804 includes the light emitting layer of GaNAs, GaNP or GaNSb crystal, and accordingly the effective mass of the electrons and holes may be made smaller than that of the conventional InGaN crystal, which suggests that population inversion for producing laser emission can be achieved with a lower carrier density (lasing threshold current can be reduced). However, this document discloses only a semiconductor laser device having a mesa structure of 5 $\mu$m or 20 $\mu$m in width as a specific example. In reality, the shape and dimension of the semiconductor laser structure have great influences on laser performance such as the lasing threshold current. This document, however, shows nothing about the relation between such a shape and dimension and laser performance.

SUMMARY OF THE INVENTION

An object of the present invention is to provide a nitride semiconductor laser device having a low threshold current and low noise by providing a specific structure to enhance the performance of the semiconductor having a light emitting layer formed of As, P or Sb containing nitride semiconductor.

The inventors of the present invention have found that in a semiconductor laser including a light emitting layer formed of nitride semiconductor containing at least one of As, P and Sb, the maximum width through which current is injected to the light emitting layer via a p-type layer considerably contributes to reduction of the threshold current. Moreover, the inventors have found that the maximum width ranging from 1.0 $\mu$m to 4.0 $\mu$m makes it possible to lower the threshold current and the maximum width ranging from 1.0 $\mu$m to 3.5 $\mu$m provides a self oscillation characteristic, as detailed later.

Here, "the maximum width through which current is injected to the light emitting layer via a p-type layer" refers to the maximum width, through which current is injected, viewed from the end surface of the resonator of the semiconductor laser. For example, a semiconductor laser with a ridge stripe structure as shown in FIG. 7(a) has "the maximum width through which current is injected to a light emitting layer via a p-type layer" corresponding to the width (W) of the ridge stripe portion. For a ridge stripe having a trapezoidal cross section as shown in FIG. 1, "the maximum width through which current is injected to a light emitting layer via a p-type layer" corresponds to the width of the bottom (maximum width) of the trapezoid. For a semiconductor laser having a current blocking layer for limiting the width through which current is injected to the light emitting layer as shown in FIG. 7(b), "the maximum width through which current is injected to the light emitting layer via a p-type layer" corresponds to the maximum width (W) between the opposing portions of the current blocking layer.

Additionally, the inventors have found that the distance from the boundary between the light emitting layer and the p-type layer to the bottom of the ridge stripe or current blocking layer also contributes to reduction of the threshold current. It is further found that such a distance of 0–0.3 $\mu$m or 0.01–0.3 $\mu$m can provide a lower threshold current.

Referring to FIG. 7(a), in the semiconductor laser having the ridge structure, the distance from the boundary between the light emitting layer and the p-type layer to the bottom of the ridge stripe corresponds to "thickness (d) of the residual film (residual film thickness)." Referring to FIG. 7(b), in the semiconductor laser having the current blocking layer, the thickness (d) from the boundary between the light emitting layer and the p-type layer to the current blocking layer contributes to reduction of the threshold current, and this thickness (d) is also hereinafter referred to as "residual film thickness."

Accordingly, the present invention is directed to a nitride semiconductor laser device including n-type and p-type layers made of nitride semiconductor and formed on a substrate and a light emitting layer arranged between the n-type and p-type layers. The light emitting layer is formed of a well layer or a combination of well and barrier layers. At least the well layer among the constituent layers of the light emitting layer is made of nitride semiconductor containing element X, N and Ga, wherein element X is at least one selected from the group consisting of As, P and Sb. In the nitride semiconductor containing the element X, N and Ga, X has an atomic fraction smaller than that of N. A maximum width through which current is injected into the light emitting layer via the p-type layer is from 1.0 µm to 4.0 µm.

The present invention is also directed to a nitride semiconductor laser device including n-type and p-type layers made of nitride semiconductor and formed on a substrate and a light emitting layer arranged between the n-type and p-type layers. The light emitting layer is formed of a well layer or a combination of well and barrier layers. At least the well layer among the constituent layers of the light emitting layer is made of nitride semiconductor containing element X, N and Ga, wherein element X is at least one selected from the group consisting of As, P and Sb. In the nitride semiconductor containing the element X, N and Ga, X has an atomic fraction smaller than that of N. A maximum width through which current is injected into the light emitting layer via the p-type layer through is from 1.0 µm to 3.5 µm. The laser device has a self oscillation characteristic.

In the present invention, the light emitting layer may have a single quantum well structure formed of one well layer only or barrier layer/well layer/barrier layer, or the light emitting layer may be composed of a plurality of well layers and a plurality of barrier layers.

Preferably, when the nitride semiconductor laser device has a ridge structure, the distance from the boundary between the light emitting layer and the p-type layer to the bottom of the ridge stripe is from 0 µm to 0.3 µm.

Preferably, when the nitride semiconductor laser device has a current blocking layer for limiting the width through which current is injected into the light emitting layer, the distance from the boundary between the light emitting layer and the p-type layer to the current blocking layer is from 0.01 µm to 0.3 µm.

In a preferred manner of the present invention, the substrate of the laser device is made of nitride semiconductor crystal or has a structure comprising a nitride semiconductor crystal film with a dislocation density of at most $10^7/cm^2$ grown on another crystal material.

According to the present invention, an optical device using the nitride semiconductor laser device as defined above is provided.

The foregoing and other objects, features, aspects and advantages of the present invention will become more apparent from the following detailed description of the present invention when taken in conjunction with the accompanying drawings.

Figure 1:
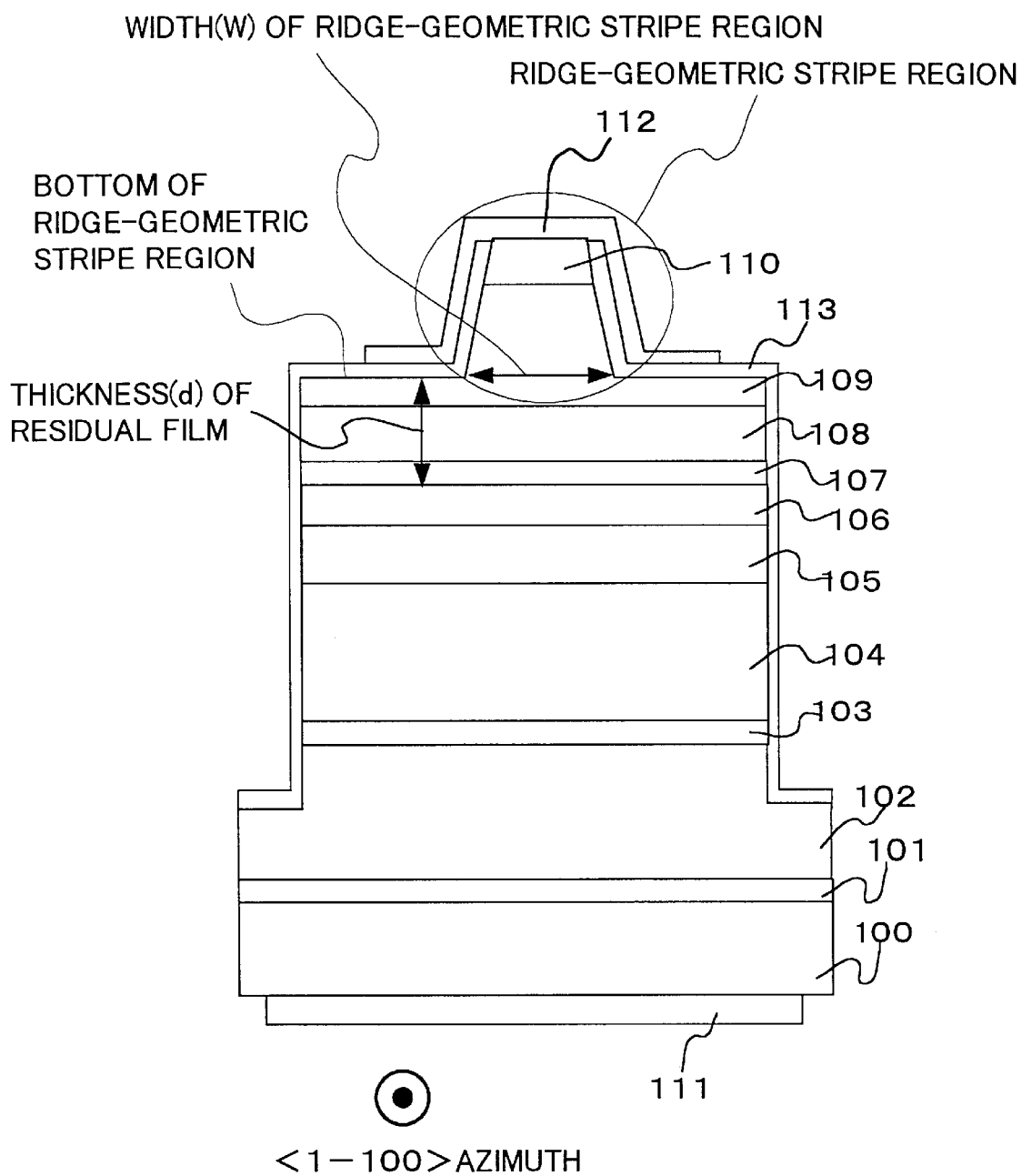
FIG. 1 is a schematic cross section showing one example of the nitride semiconductor laser device having a ridge stripe structure according to the present invention.

Components in the drawings denoted by respective reference numerals include n-type GaN substrate 100, low temperature GaN buffer layer 101, n-type GaN layer 102, n-type $In_{0.07}Ga_{0.93}N$ anti-crack layer 103, n type $Al_{0.1}Ga_{0.9}N$ cladding layer 104, n-type GaN light guiding layer 105, light emitting layer 106, p-type $Al_{0.2}Ga_{0.8}N$ carrier block layer 107, p-type GaN light guiding layer 108, p-type $Al_{0.1}Ga_{0.9}N$ cladding layer 109, p-type $Al_{0.1}Ga_{0.9}N$ first cladding layer 109a, p-type $Al_{0.1}Ga_{0.9}N$ second cladding layer 109b, p-type GaN contact layer 110, n electrode 111, p electrode 112, $SiO_2$ dielectric film 113, current blocking layer 120, quasi GaN substrate 400, seed substrate 401, low temperature buffer layer 402, n-type GaN film 403, first n-type GaN film 403a, second n-type GaN film 403b, growth suppression film 404, n-type GaN thick film 405 and substrate 500. 406 indicates the portion directly above the center of the width of the growth suppression film, 407 indicates the portion directly above the center of the width of the portion where no growth suppression film is formed, 408 indicates the portion directly above the center of the width of a groove, and 409 indicates the portion directly above the center of the width of the part where no groove is formed (hill).

DESCRIPTION OF THE PREFERRED EMBODIMENTS

The nitride semiconductor laser according to the present invention has a light emitting layer made of nitride semiconductor crystal containing at least one of As, P and Sb. It is accordingly possible to reduce the effective mass of electrons and holes compared with that of the conventional light emitting layer of InGaN. The following two advantages of the nitride semiconductor laser device are thus achieved according to the present invention.

First advantage: A reduced carrier density can be used to cause population inversion for producing laser emission.

Second advantage: The mobility of carriers in the light emitting layer can be enhanced.

The first advantage means that a lower lasing threshold current is possible compared with that of the conventional InGaN crystal and that fast modulation of the semiconductor laser is also possible. The fast modulation characteristic can be applied to an optical disk read/write device having a nitride semiconductor laser to reduce interference effect of light beams emitting from and returning to the laser (low noise) and enhance the reliability of information reading by the optical disk.

The second advantage means that, even if electrons and holes disappear due to the recombination resulting from radiation, new electrons and holes are injected at a higher rate than that of the conventional InGaN crystal. Then, noise can be reduced by the fast modulation of electrons and holes as described above and self oscillation characteristic of the nitride semiconductor laser can remarkably be improved. In addition, the light emitting layer has a lower electric resistance and thus the device voltage is decreased.

Figure 8:
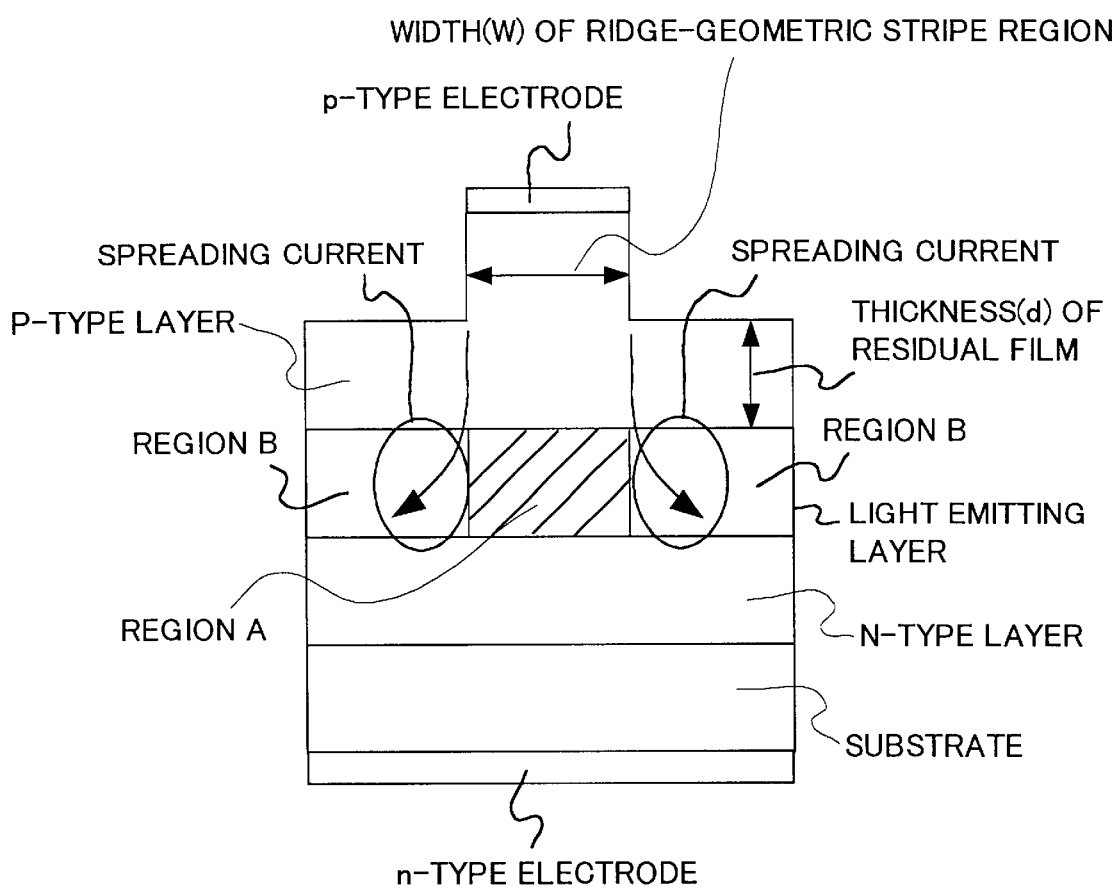
FIG. 8 illustrates spread of injected current in a laser device.

However, it has been found that, in order to achieve the advantages above with the nitride semiconductor laser, the stripe width and the residual film thickness must appropriately be defined to form narrowed current injection. In particular, in order to achieve the lower threshold current, a specific stripe width must be set for the nitride semiconductor light emitting layer containing any of As, P and Sb. This is because carriers in the nitride semiconductor light emitting layer containing any of As, P and Sb have a greater mobility (second advantage) than those in the conventional InGaN crystal, which increases the extent of the current spreading in the light emitting layer. This spreading current as shown in FIG. 8 occupies a greater region than the current region in which the current is injected via the p electrode (the current region corresponding to the stripe width shown in FIG. 8). When the spreading current occupies a greater area than region A of the light emitting layer to which current should be injected (the spreading current intrudes into region B), the carrier density becomes lower and thus a greater amount of current (threshold current) is necessary to cause population inversion for laser emission. It has been found that unless the stripe width is specifically and appropriately set for the light emitting layer, the lower threshold current as one advantage as described above cannot be achieved.

Figure 9:
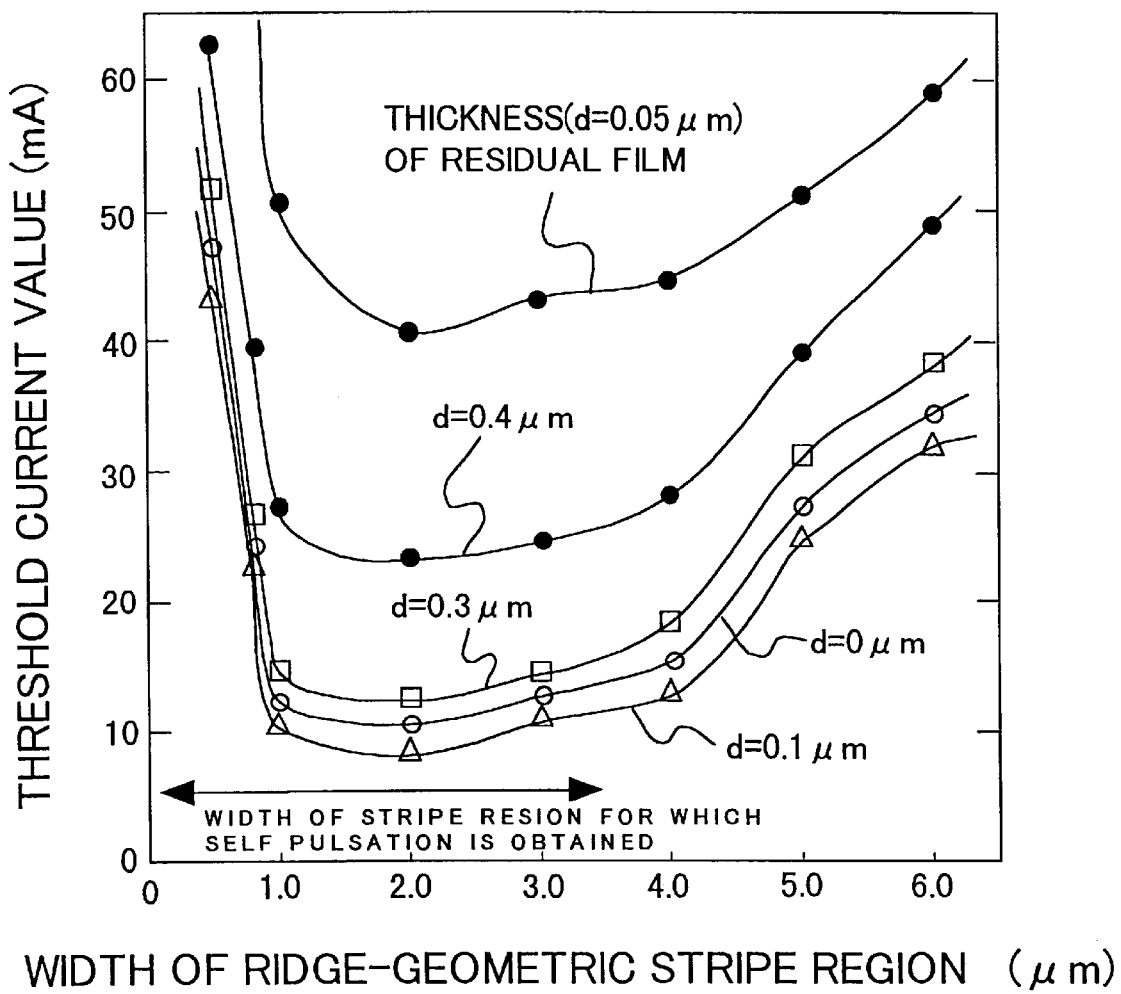
FIG. 9 shows a relationship between a stripe width and a threshold current of a nitride semiconductor laser.

Investigations have been carried out into a suitable stripe width to find the relationship as shown in FIG. 9 between the stripe width and threshold current for generating laser emission. FIG. 9 shows characteristics of a nitride semiconductor laser device having a light emitting layer with the structure of $GaN_{0.97}P_{0.03}$ well layer/GaN barrier layer. As shown in FIG. 9, the threshold current is low with respect to the stripe width from 1.0 $\mu$m to 4.0 $\mu$m. On the other hand, it can be seen that the threshold current sharply increases as the stripe width increases from 4.0 $\mu$m to 5.0 $\mu$m or decreases from 1.0 $\mu$m to 0.8 $\mu$m (on the condition that the residual film thickness (d)$\geq$0). This pattern has also been found when the nitride semiconductor constituting the well layer contains As or Sb in place of P. Then, it has been found that the stripe width appropriate for the nitride semiconductor light emitting layer containing at least one of As, P and Sb is from 1.0 $\mu$m to 4.0 $\mu$m.

As shown in FIG. 9, the reason why the threshold current increases with the stripe width smaller than 1.0 $\mu$m should be that such a narrow stripe width can cause leak current to the outside of the stripe width, which is greater than that to the injection region (corresponding to the stripe width, see FIG. 8). On the other hand, when the stripe width is greater than 4.0 $\mu$m, a decreased current density should be responsible for the increase in the threshold current.

Figure 7A:
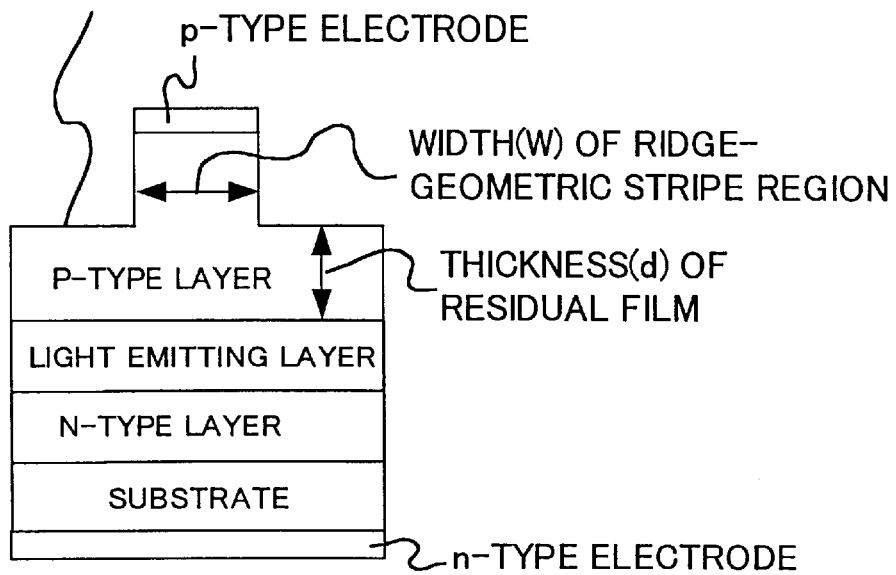
FIGS. 7(a) and 7(b) schematically show a stripe width and a residual film thickness.
Figure 7B:
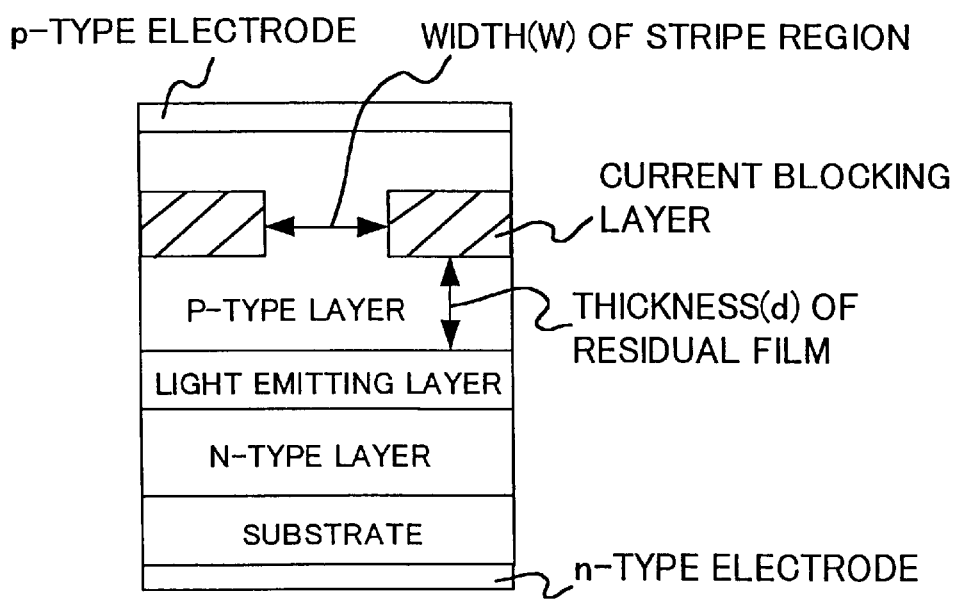

The relationship between the stripe width and threshold current shown in FIG. 9 is applied not only to the semiconductor laser device as shown in FIG. 7(a) having a ridge stripe structure (mesa structure) but also to the nitride semiconductor laser device having a current blocking layer as shown in FIG. 7(b).

FIG. 9 also shows that the threshold current can also be reduced by adjusting the residual film thickness (d) shown in FIGS. 1, 7(a) and 7(b) in addition to the appropriate stripe width (1.0 $\mu$m to 4.0 $\mu$m) as described above. The mechanism as described below may be applied to the fact that the residual film thickness also has an appropriate value for achieving the lower threshold current.

Figure 10:
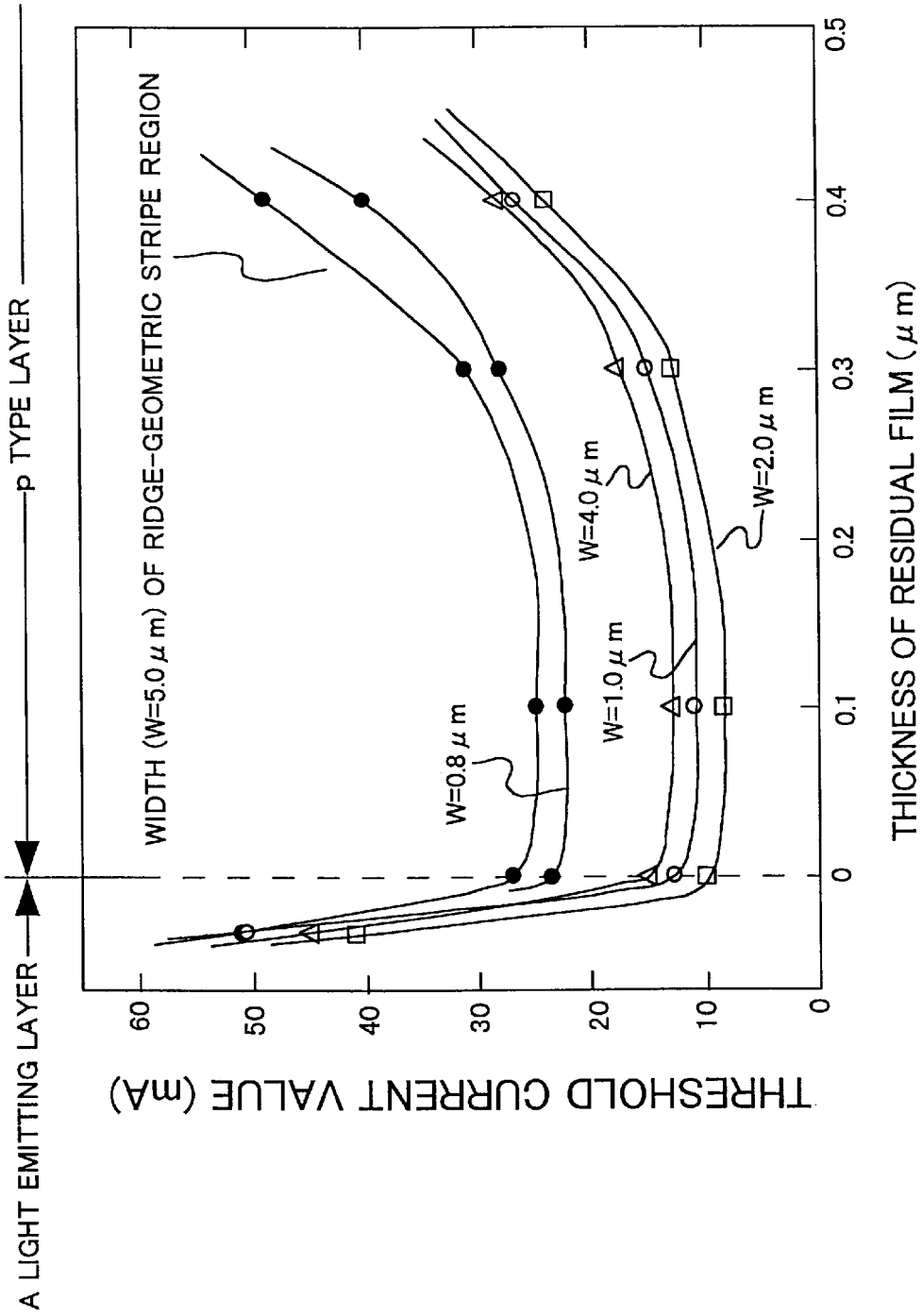
FIG. 10 shows a relationship between a residual film thickness and a threshold current of a nitride semiconductor laser.

Similarly to the spreading current in the light emitting layer (FIG. 8), current from the p-type electrode can spread in the p-type layer before reaching the light emitting layer. The current spreading in the p-type layer should be smaller than that in the light emitting nitride semiconductor layer containing any of As, P and Sb and accordingly has a smaller influence on the threshold current than that in the light emitting layer. This is because the p-type layer of the nitride semiconductor generally has a high resistance and thus carriers have a small mobility. However, when the residual film thickness exceeds a certain limit, the current spreading in the p-type layer cannot be negligible, meaning that efficient injection of current into the light emitting layer in region A is impossible, and consequently the threshold current increases. On the other hand, when the ridge stripe portion is made into the light emitting layer (this is shown in FIG. 10 as negative residual film thickness (smaller than 0 $\mu$m)), the threshold current exhibits a remarkable increase. This may be because such a ridge stripe structure significantly degrades the light emitting layer so that the gain can considerably be reduced, resulting in the increase in the threshold current.

FIG. 10 shows a relationship between the residual film thickness shown in FIG. 7(a) and threshold current for generating laser emission. In FIG. 10, characteristics are shown of a nitride semiconductor laser device having a light emitting layer with the structure of $GaN_{0.97}P_{0.03}$ well layer/ GaN barrier layer. FIG. 10 shows that the threshold current is low with resect to the residual film thickness from 0 $\mu$m to 0.3 $\mu$m. The threshold current remarkably increases as the residual film thickness goes from 0 $\mu$m to −0.5 $\mu$m or from 0.3 $\mu$m to 0.4 $\mu$m. A similar pattern is also found when nitride semiconductor constituting the well layer contains As or Sb in place of P. Consequently, a film thickness from 0 $\mu$m to 0.3 $\mu$m should be advantageous for the semiconductor laser device having the ridge structure. FIG. 10 also suggests that the threshold current can further be reduced when the stripe width (W) ranges from 1.0 $\mu$m to 4.0 $\mu$m and the residual film thickness meets its appropriate value (from 0 $\mu$m to 0.3 $\mu$m).

The relationship between the residual film thickness and threshold current as shown in FIG. 10 is applied not only to the semiconductor laser device as shown in FIG. 7(a) having the ridge stripe structure (mesa structure) but also to the nitride semiconductor laser device having the current blocking layer as shown in FIG. 7(b). However, the residual film thickness (d) of the nitride semiconductor laser device having the current blocking layer should be at least 0.01 $\mu$m. Our investigations have revealed that, in the nitride semiconductor laser device having the current blocking layer, the current blocking layer does not work when the residual film thickness is smaller than 0.01 $\mu$m. Accordingly, the residual film thickness of the nitride semiconductor laser device having the current blocking layer is desirably from 0.01 $\mu$m to 0.3 $\mu$m.

Figure 11:
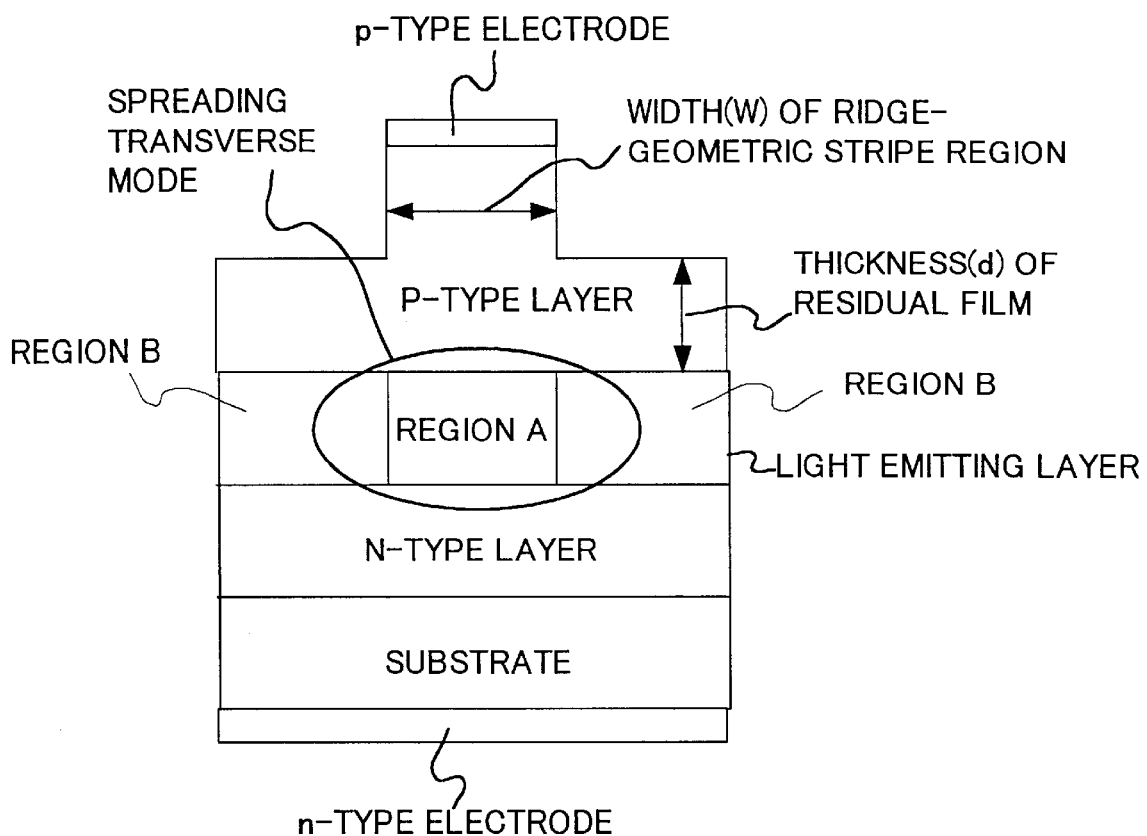
FIG. 11 illustrates self oscillation.

The light emitting nitride semiconductor layer containing any of As, P and Sb is appropriate for a self oscillation type laser as discussed above regarding the advantages. It has also been found that the self oscillation is achieved by controlling the stripe width corresponding to the current-injected region. As shown in FIG. 11, as the stripe width decreases, the transverse mode light spreads over an area greater than current-injected region A, so that the light is absorbed by the carriers in region B. Then, region B of the light emitting layer serves as a saturable absorber layer to provide the self oscillation characteristic. This self oscillation characteristic has been observed when the stripe width is smaller than 3.5 μm as shown in FIG. 9. Accordingly, the stripe width should be from 1.0 μm to 3.5 μm for achieving the low threshold current and self oscillation characteristic.

The stripe width from 1.0 μm to 3.5 μm required for achieving the self oscillation characteristic is specific to the nitride semiconductor light emitting layer containing any of As, P and Sb. This is because the effective mass of electrons and holes, carrier mobility, refractive index and the like that is involved with the self oscillation depend on the composition of the light emitting layer. Therefore, the parameters appropriate for the conventional light emitting layer of InGaN crystal cannot provide useful hints to set parameters appropriate for the nitride semiconductor light emitting layer containing any of As, P and Sb.

A nitride semiconductor laser device was manufactured and examined for a lifetime characteristic, which had a stripe width and a residual film thickness in the appropriate ranges. As a result, the lifetime was 1000 hours or longer under the conditions of ambient temperature 60° C. and output 50 mW. This suggests that a high-power nitride semiconductor laser can be obtained according to the present invention, and that is suitable for an optical pickup device for recording/reproducing.

In the present invention, at least a well layer among the layers constituting the light emitting layer is made of nitride semiconductor containing element X that is at least one selected from the group consisting of As, P and Sb. In the light emitting layer composed of a combination of well and barrier layers, only the well layer may be made of such nitride semiconductor or the well and barrier layers may be made of such nitride semiconductor. The nitride semiconductor further contains Ga and N. Element X of the nitride semiconductor has an atomic fraction smaller than that of N. The ratio of the number of the atoms of element X ($N_1$) relative to the sum of the number of the atoms of element X ($N_1$) and that of element N ($N_2$) is preferably 30% atomic percent or lower, and more preferably 20% or lower. Moreover, element X in any layer(s) (well layer or well and barrier layers) made of such nitride semiconductor preferably has a concentration of at least $1\times10^{18}/cm^3$. When the ratio $\{N_1/(N_1+N_2)\}\times100$ (%) is higher than 20%, different regions with different contents of As, P or Sb can gradually generated in the well layer (that may be called phase separation). When the ratio $\{N_1/(N_1+N_2)\}\times100$ (%) is higher than 30%, the phase separation can turn into crystal system separation in which a mixture of hexagonal system and cubic system is generated. When the portion generating such crystal system separation constitutes 50% or more of the well layer, the crystallinity of the well layer is considerably deteriorated and thus the threshold current can increase. When the concentration of element X is smaller than $1\times10^{18}/cm^3$, the advantageous effects of the defined stripe width and residual film thickness could be small in the present invention. The discussion above concerning the well layer is also applicable to the barrier layers. However, the barrier layers may not contain As, P or Sb as the well layer, and it is essential only that the barrier layers have a band gap energy greater than that of the well layer.

In the present invention, the well layer preferably has a thickness from 0.4 nm to 20 nm. When the thickness of the well layer is smaller than 0.4 nm, the level for carrier confinement by the quantum well effect is so high that the emission efficacy can be reduced. On the other hand, a thickness of the well layer greater than 20 nm could deteriorate the crystallinity depending on the ratio of As, P, or Sb added to the well layer.

Preferably, the barrier layer has a thickness from 1 nm to 20 nm in the present invention. When the barrier layer has a smaller thickness than 1 nm, a sufficient carrier confinement could be impossible. On the other hand, when the barrier layer has a greater thickness than 20 nm, a sub band structure for the multiple quantum well layer could be difficult to form.

In the present invention, the nitride semiconductor constituting at least the well layer can typically be represented by the formula, $In_xAl_yGa_{1-x-y}N_tAs_uP_vSb_z$ ($0 \leq x \leq 1$, $0 \leq y < 1$, $0 \leq u+v+z \leq t$). In this formula, t+u+v+z could be 1. At least one of u, v and z is not 0. (u+v+z) I (u+v+z+t) is preferably 0.3 or smaller and more preferably 0.2 or smaller.

The light emitting layer may be constituted of a combination of well and barrier layers as shown in Table 1. In Table 1, the triangle, circle and double circle respectively represent a combination, a preferable combination and a most preferable combination for the light emitting layer according to the present invention. The nitride semiconductor constituting the light emitting layer is further detailed below.

TABLE 1

| well layer | barrier layer | | | | | | | | |
|---|---|---|---|---|---|---|---|---|---|
| | GaN | GaNAs | GaNP | GaNSb | InGan | InGaNAs | InGaNP | InGaNSb | AlGaN |
| GaNAs | ⊙ | ○ | ○ | △ | ⊙ | ○ | ○ | △ | ○ |
| GaNP | ⊙ | ○ | ○ | △ | ⊙ | ○ | ○ | △ | ○ |
| GaNSb | △ | △ | △ | △ | △ | △ | △ | △ | △ |
| InGaNAs | ⊙ | ○ | ○ | △ | ⊙ | ○ | ○ | △ | ○ |
| InGaNP | ⊙ | ○ | ○ | △ | ⊙ | ○ | ○ | △ | ○ |
| InGaNSb | △ | △ | △ | △ | △ | △ | △ | △ | △ |
| AlGaNAs | ⊙ | ○ | ○ | △ | ⊙ | △ | △ | △ | ⊙ |
| AlGaNP | ⊙ | ○ | ○ | △ | ⊙ | △ | △ | △ | ⊙ |
| AlGaNSb | △ | △ | △ | △ | △ | △ | △ | △ | △ |
| InAlGaNAs | ⊙ | ○ | ○ | △ | ⊙ | △ | △ | △ | ⊙ |
| InAlGaNP | ⊙ | ○ | ○ | △ | ⊙ | △ | △ | △ | ⊙ |
| InAlGaNSb | △ | △ | △ | △ | △ | △ | △ | △ | △ |

TABLE 1-continued

| well layer | barrier layer | | | | | | |
|---|---|---|---|---|---|---|---|
| | AlGaNAs | AlGaNP | AlGaNSb | InAlGaN | InAlGaNAs | InAlGaNP | InAlGaNsb |
| GaNAs | Δ | Δ | Δ | ◯ | Δ | Δ | Δ |
| GaNP | Δ | Δ | Δ | ◯ | Δ | Δ | Δ |
| GaNSb | Δ | Δ | Δ | Δ | Δ | Δ | Δ |
| InGaNAs | Δ | Δ | Δ | ◯ | Δ | Δ | Δ |
| InGaNP | Δ | Δ | Δ | ◯ | Δ | Δ | Δ |
| InGaNSb | Δ | Δ | Δ | Δ | Δ | Δ | Δ |
| AlGaNAs | ◯ | ◯ | Δ | ◯ | Δ | Δ | Δ |
| AlGaNP | ◯ | ◯ | Δ | ◯ | Δ | Δ | Δ |
| AlGaNSb | Δ | Δ | Δ | Δ | Δ | Δ | Δ |
| InAlGaNAs | ◯ | ◯ | Δ | ⊚ | ◯ | ◯ | Δ |
| InAlGaNP | ◯ | ◯ | Δ | ⊚ | ◯ | ◯ | Δ |
| InAlGaNSb | Δ | Δ | Δ | Δ | Δ | Δ | Δ |

⊚ ... a most preferable combination of well + barrier layers for the light emitting layer of the present invention
◯ ... a preferable combination of well + barrier layers for the light emitting layer of the present invention
Δ ... a combination of well + barrier layers for the light emitting layer of the present invention GaNX well layer (X is As, P, Sb or an arbitrary combination thereof):

If a well layer is formed of GaNX crystal, it does not contain In and is thus free of the In segregation-induced phase separation. The In phase separation herein means that a single layer is separated into a region with a high In content and a region with a low In content (and the regions are mixed in the layer). The well layer free of the In-induced phase separation does not have a non-light emitting region caused by a high In content and it can preferably be free of a factor increasing the threshold current value of the device.

Of GANX crystals, the 3-element mixed crystal of GaNAs, GaNP or GaNSb has a composition easier to control than the 4-element mixed crystal of GaNAsP and the 5-element mixed crystal of GaNAsPSb. Thus the targeted wavelength can be obtained in a good reproducibility. Of P, As and Sb, P has a atomic radius (a Van der Waals radius or covalent bond radius) closest to that of N and therefore it can displace a portion of the N atoms in the mixed crystal more easily than As and Sb. Thus GaN with P added thereto, or GaNP, can have good crystallinity. This suggests that an increased P content in GaNP may not so severely degrade the crystallinity of the mixed crystal. When the light emitting device uses a GaNP well layer, the GaNP crystal can cover a wide emission wavelength range from ultra violet light emission to red light emission.

Of P, As, and Sb, Sb has the largest atomic radius (or Van der Waals radius or covalent bond radius) relative to that of N, and as compared to As and Sb, it has a weaker tendency to displace a portion of the N atoms in the mixed crystal. However, the Sb atomic radius greater than that of As and P can prevent the removal of highly volatile N atoms from the mixed crystal and thus make the crystallinity of GaNSb good.

The atomic radius of As is intermediate between those of P and Sb and therefore GaNAs can preferably have both characteristics of GaNP and GaNSb.

A light emitting device employing the GaNX well layer can produce various emission wavelengths by modulating the ratio of As, P or Sb in the well layer. For example, an emission wavelength of about 380 nm (ultraviolet radiation) can be produced by $GaN_{1-x}As_x$ (x=0.005), $GaN_{1-y}P_y$ (y=0.01) and $GaN_{1-z}Sb_z$ (z=0.002). An emission wavelength of about 410 nm (violet radiation) can be produced by $GaN_{1-x}A_x$ (x=0.02), $GaN_{1-y}P_y$ (y=0.03) and $GaN_{1-z}Sb_z$ (z=0.01). An emission wavelength of about 470 nm (blue radiation) can be produced by $GaN_{1-x}As_x$ (x=0.03), $GaN_{1-y}P_y$ (y=0.06) and $GaN_{1-z}Sb_z$ (z=0.02). An emission wavelength of about 520 nm (green radiation) can be produced by $GaN_{1-x}As_x$ (x=0.05), $GaN_{1-y}P_y$ (y=0.08) and $GaN_{1-z}Sb_z$ (z=0.03). An emission wavelength of about 650 nm (red radiation) can be produced by $GaN_{1-x}As_x$ (x=0.07), $GaN_{1-y}P_y$ (y=0.12) and $GaN_{1-z}Sb_z$ (z=0.04). The above composition ratios or near ratios for the well layer can complete the targeted emission wavelength.

When Al is added to the GaNX well layer, the As, P or Sb content should be higher than that for the aforementioned emission wavelengths, because the Al added increases the band gap energy. The addition of Al to the GaNX well layer is preferable, however, because the crystallinity of the well layer can be improved. The N element in the GaNX well layer is significantly more volatile than As, P and Sb, and N can readily be removed from the crystal, so that the crystallinity of the well layer can be degraded. When Al is added to the GaNX well layer, Al that is highly reactive can strongly combine with N, so that the removal of N from the well layer can be prevented and the degradation in crystallinity can be reduced.

The GaNX well layer is preferably combined with a barrier layer of GaN, GaNAs, GaNP, InGaN, InGaNAs, InGaNP, AlGaN or InAlGaN. Particularly, in GaN, InGaN, AlGaN, which are a 2-element mixed crystal or a 3-element mixed crystal composed of two types of Group III elements and one type of a Group V element, the composition can readily be controlled and therefore desired compounds can be formed in a good reproducibility. In particular, InGaN is preferable as its crystallinity can be better than that of GaN or AlGaN when it is produced at the temperature range for growing the GaNX well layer, such as 600° C. to 800° C. When the barrier layer is made of GaN, the crystallinity of which can be better than that of AlGaN, the interface between the well and barrier layers can be so flat that the luminous efficacy can be improved.

InGaNX Well Layer

When the well layer is formed of InGaNX crystal, it can have the phase separation due to the effect of the In segregation. Like In, however, As, P or Sb can reduce the band gap energy of the well layer, and therefore the In content in the InGaNX well layer can be lower that that in the conventional InGaN well layer to give a targeted emission wavelength. When at least one of As, P and Sb is added to the In-containig well layer, the content of In can be low (so that the phase separation can be reduced) while the well layer can have moderate In segregation. The moderate In segregation can provide a localized level for the trap of the carriers of the electrons and holes, so that the luminous efficacy can be improved and the threshold current value can be lowered.

Of InGaNX crystals, the 4-element mixed crystal of InGaNAs, InGaNP or InGaNSb can have a composition easier to control than the 5-element mixed crystal of InGaNAsP and the 6-element mixed crystal of InGaNAsPSb, so that the targeted emission wavelength can be provided in a good reproducibility.

Of P, As, and Sb, P has an atomic radius (a Van der Waals radius or covalent bond radius) closest to that of N, and as compared to As and Sb, it has a stronger tendency to displace a portion of the N atoms in the mixed crystal. Thus InGaN with P added thereto, or InGaNP, can have a good crystallinity. This suggests that an increased P content in InGaNP may not so severely degrade the crystallinity of the mixed crystal. When the light emitting device uses a InGaNP well layer, the InGaNP crystal can cover a wide emission wavelength range from ultra violet light emission to red light emission.

Of P, As, and Sb, Sb has the largest atomic radius (or Van der Waals radius or covalent bond radius) relative to that of N, and as compared with As or Sb, it has a weaker tendency to displace a portion of the N atoms in the mixed crystal. However, the Sb atomic radius greater than that of As and P can prevent the removal of highly volatile N atoms from the mixed crystal and thus make the crystallinity of InGaNSb good.

The atomic radius of As is intermediate between those of P and Sb and therefore InGaNAs can preferably have both characteristics of InGaNP and InGaNSb.

The emission wavelength of the light emitting layer employing the InGaNX well layer can be modified by the modulation of the As, P or Sb content in the well layer. For example, Table 2 presents a relationship between the compositions of InGaNAs and InGaNP, and the emission wavelength. In preparing the well layer, the compositions shown in Table 2 or near compositions can complete the targeted emission wavelength.

When Al is added to the InGaNX well layer, the In content and the As, P or Sb content should be higher than those for the emission wavelengths as shown in Table 2, because the Al added increases the band gap energy. The addition of Al to the InGaNX well layer is preferable, however, because the crystallinity of the well layer can be improved. The N element in the InGaNX well layer is significantly more volatile than As, P and Sb, and N can readily be removed from the crystal, so that the crystallinity of the well layer can be degraded. When Al is added to the InGaNX well layer, Al that is highly reactive can strongly combine with N, so that the removal of N from the well layer can be inhibited.

The InGaNX well layer is preferably combined with a barrier layer of GaN, GaNAs, GaNP, InGaN, InGaNAs, InGaNP, AlGaN or InAlGaN. Particularly, in GaN, InGaN, AlGaN, which are a 2-element mixed crystal or a 3-element mixed crystal composed of two types of Group III elements and one type of a Group V element, the composition can readily be controlled and therefore desired compounds can be formed in a good reproducibility. In particular, InGaN is preferable as its crystallinity can be better than that of GaN or AlGaN when it is produced at the temperature range for growing the InGaNX well layer, such as 600° C. to 800° C. When the barrier layer is made of GaN, the crystallinity of which can be better than that of AlGaN, the interface between the well and barrier layers can be so flat that the luminous efficacy can be improved.

FIG. 1 shows a nitride semiconductor laser device of a ridge stripe structure that is used to find out an appropriate stripe width and residual film thickness as described above.

Referring to FIG. 1, the nitride semiconductor laser device is composed of a C plane (0001) n-type GaN substrate 100, a low temperature GaN buffer layer 101, an n-type GaN layer 102, an n-type $In_{0.07}Ga_{0.93}N$ anti-crack layer 103, an n-type $Al_{0.1}Ga_{0.9}N$ cladding layer 104, an n-type GaN light guiding layer 105, a light emitting layer 106, a p-type $Al_{0.2}Ga_{0.8}N$ carrier block layer 107, a p-type GaN light guiding layer 108, a p-type $Al_{0.1}Ga_{0.9}N$ cladding layer 109, a p-type GaN contact layer 110, an n electrode 111, a p electrode 112 and an $SiO_2$ dielectric film 113. This laser device is manufactured through the following process.

First, n-type GaN substrate 100 is set in an MOCVD (metal organic chemical vapor deposition) apparatus, and $NH_3$ (ammonia) (group V element source material) and TMGa (trimethylgallium) or TEGa (triethylgallium) (group III element source material) are used to grow low tempera-

TABLE 2

| Emission wavelength | In(y = 0.01) | In(y = 0.02) | In(y = 0.05) | In(y = 0.1) | In(y = 0.2) | In(y = 0.35) |
|---|---|---|---|---|---|---|
| $In_yGa_{1-y}N_{1-x}As_x$ | | | | | | |
| 380 nm | 0.005 | 0.004 | 0.001 | — | — | — |
| 400 nm | 0.012 | 0.011 | 0.008 | 0.003 | — | — |
| 410 nm | 0.016 | 0.015 | 0.011 | 0.006 | — | — |
| 470 nm | 0.034 | 0.033 | 0.029 | 0.024 | 0.014 | 0.001 |
| 520 nm | 0.046 | 0.045 | 0.041 | 0.036 | 0.025 | 0.012 |
| 650 nm | 0.07 | 0.069 | 0.065 | 0.059 | 0.048 | 0.034 |
| $In_yGa_{1-y}N_{1-x}P_x$ | | | | | | |
| 380 nm | 0.008 | 0.006 | 0.001 | — | — | — |
| 400 nm | 0.02 | 0.018 | 0.013 | 0.004 | — | — |
| 410 nm | 0.025 | 0.023 | 0.018 | 0.01 | — | — |
| 470 nm | 0.055 | 0.053 | 0.047 | 0.038 | 0.022 | 0.001 |
| 520 nm | 0.075 | 0.073 | 0.067 | 0.058 | 0.041 | 0.019 |
| 650 nm | 0.116 | 0.114 | 0.107 | 0.097 | 0.079 | 0.055 |

P content (x) for wavelength of $In_yGa_{1-y}N_{1-x}As_x$ crystal
P content (x) for wavelength of $In_yGa_{1-y}N_{1-x}P_x$ crystal ture GaN buffer layer 101 to the thickness of 100 nm at a growth temperature of 550° C. Then, at a growth temperature of 1050° C., $SiH_4$ (silane) is added to the materials above to form n-type GaN layer 102 (Si impurity concentration $1\times10^{18}/cm^3$) to 3 μm. The growth temperature is lowered to approximately 700° C.–800° C. and TMIn (trimethylindium) (group III element source material) is supplied to grow n-type $In_{0.07}Ga_{0.93}N$ anti-crack layer 103 to 40 nm. The substrate temperature is raised to 1050° C. and TMAl (trimethylaluminum) or TEAl (triethylaluminum) (group III element source material) is used to grow 0.8 μm-thick n-type $Al_{0.1}Ga_{0.9}N$ cladding layer 104 (Si impurity concentration $1\times10^{18}/cm^3$) and then n-type GaN light guiding layer 105 (Si impurity concentration $1\times10^{18}/cm^3$) is grown to 0.1 μm.

The substrate temperature is decreased to 800° C. and $PH_3$ or TBP (t-butyl phosphine) is added as a P source material to grow light emitting layer (multiple quantum well structure) 106 of 3-cycle which is formed of $GaN_{0.97}P_{0.03}$ well layers each of 4 nm in thickness and GaN barrier layers each of 8 nm in thickness in the order: barrier layer/well layer/barrier layer/well layer/barrier layer/well layer/barrier layer. At this time, $SiH_4$ is added to both of the barrier and well layers (Si impurity concentration $1\times10^{18}/cm^3$). A growth break interval from 1 to 180 seconds may be provided between the barrier layer growth and the well layer growth or between the well layer growth and the barrier layer growth. This is preferable because flatness of each layer is enhanced and emission half-width decreases.

When As is added to the light emitting layer, $AsH_3$ or TBAs (t-butyl arsine) may be added. When Sb is added to the light emitting layer, TMSb (trimethylantimony) or TESb (triethylantimony) may be added. In place of $NH_3$, dimethylhydrazine may be added as the N source material.

Then, the substrate temperature is raised again to 1050° C. to grow 20 nm-thick p-type $Al_{0.2}Ga_{0.8}N$ carrier block layer 107, 0.1 μm-thick p-type GaN light guiding layer 108, 0.5 μm-thick p-type $Al_{0.1}Ga_{0.9}N$ cladding layer 109, and 0.1 μm-thick p-type GaN contact layer 110. For p-type impurity, Mg (source material: $EtCP_2Mg$ (bisethylcyclopentadienyl magnesium)) is added at $5\times10^{19}/cm^3$–$2\times10^{20}/cm^3$. It is preferred that the concentration of the p-type impurity in p-type GaN contact layer 110 increases toward p electrode 112. This can provide a low contact resistance for the formation of the p electrode. In order to remove the residual hydrogen in the p-type layer that prevents activation of the p-type impurity Mg, a slight amount of oxygen may be added to the p-type layer being grown.

After p-type GaN contact layer 110 is grown, the atmosphere in the reactor of the MOCVD apparatus is replaced by absolute nitrogen carrier gas and $NH_3$ and the temperature is decreased at a rate of 60° C./minute. After the substrate temperature reaches 800° C., the $NH_3$ supply is stopped and the substrate is allowed to stand at 800° C. for five minutes and its temperature is then lowered to room temperature. In this process, the substrate may preferably be held at a temperature of 650° C. to 900° C. and allowed to stand for three to ten minutes. The temperature may also be reduced preferably at a rate of not less than 30° C./minute. The grown film is evaluated by Raman spectroscopy and it has been found that the film already has p-type characteristics (i.e., Mg is already activated) without annealing, a conventional technique for making nitride semiconductor films have p-type conductivity. The contact resistance has already been reduced enough for forming the p electrode. When the conventional annealing to give p-type conductivity is also used, the rate of activated Mg is preferably improved.

Then the epi-wafer is taken out from the MOCVD apparatus and processed to form a laser device. Hf and Au metal films is deposited in this order on the back surface of n-type GaN substrate 100 to form n electrode 111. Then electrode materials may be replaced by Ti/Al, Ti/Mo, Hf/Al or the like. Hf is preferably used to reduce the contact resistance of the n electrode.

In forming the p electrode portion, etching is performed in <1-100> direction of the GaN substrate to shape a ridge stripe portion (see FIG. 1). Various stripe widths (W) and residual film thicknesses (d) are set to form different ridge stripe portions. $SiO_2$ dielectric film 113 is thereafter vapor-deposited and p-type GaN contact layer 110 is exposed. Vapor deposition in the order Pd/Mo/Au is done to produce p electrode 112. Instead of this p electrode material, Pd/Pt/Au, Pd/Au or Ni/Au may be used.

Figure 2:
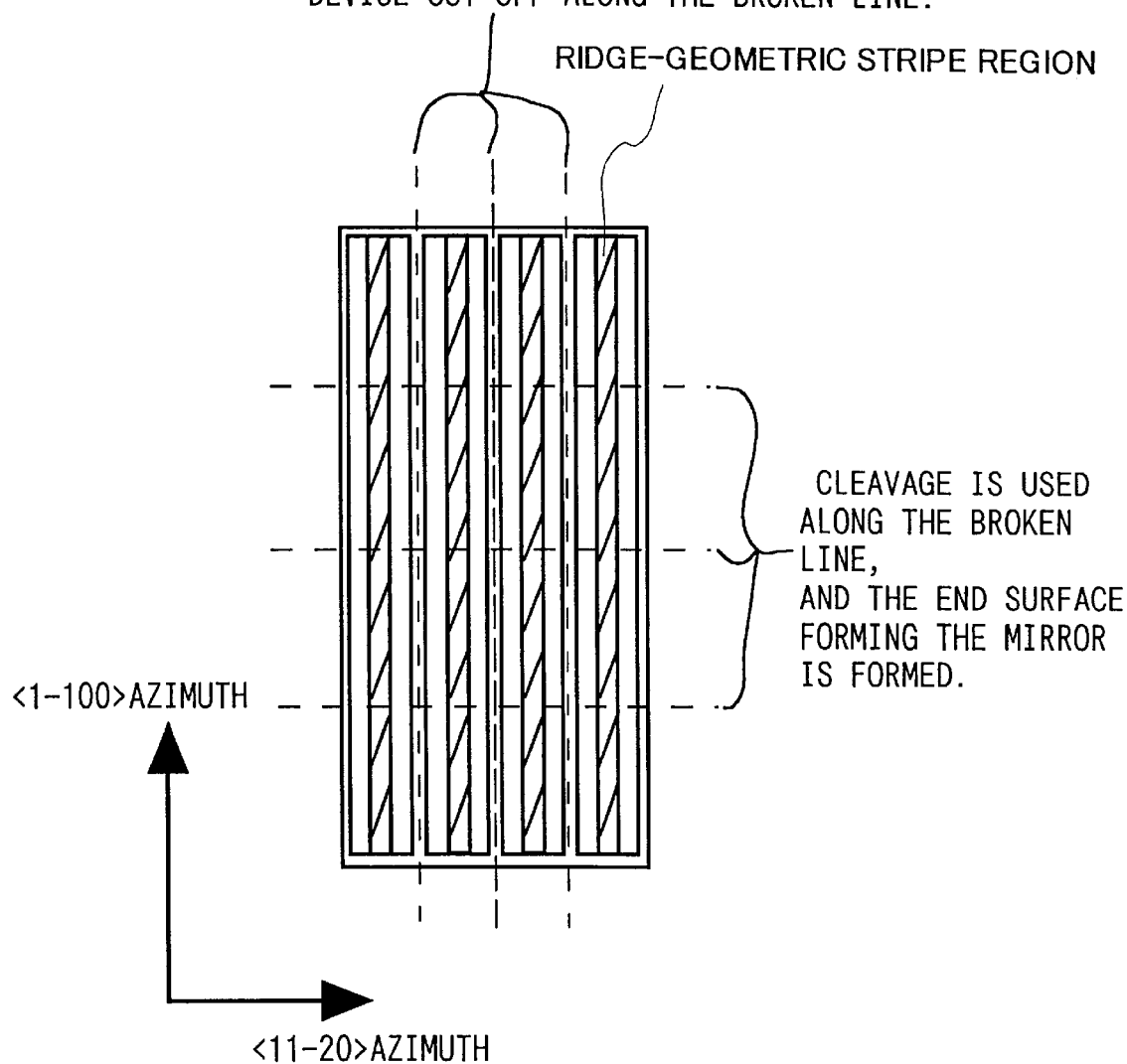
FIG. 2 is a plan view schematically showing a wafer before being divided into laser chips with nitride semiconductor laser devices formed therein.

Finally, cleavage planes of the GaN substrate are utilized to form Fabry-Perot resonators each of 500 μm in length. In general, the resonator length is preferably from 300 μm to 1000 μm. The mirror end surface of the resonator is formed to have M plane ({1-100} plane) of the GaN substrate (FIG. 2). The cleavage for forming the mirror end surface as well as the division into laser device chips are done by means of a scriber. The cutting is carried out from the substrate side along the broken line shown in FIG. 2. In the process of the cleavage to form the mirror end surface, the scriber does not scratch across the wafer surface to generate cleavage, but scratches only a part, i.e., both ends, of the wafer for the cleavage. Accordingly, the end surface can sharply be shaped and there remains no shaving attaching to the epi-surface after scribing so that an enhanced yield is attained. Instead of the feedback method of the laser resonator as discussed above, generally known DFB (Distributed Feedback) and DBR (Distributed Bragg Reflector) may be used. After the mirror end surface of the Fabry-Perot resonator is formed, dielectric films of $SiO_2$ and $TiO_2$ having a reflectance of 70% are alternately deposited on the mirror end surface to form a dielectric multilayer reflection film. Instead of this dielectric materials, $SiO_2/Al_2O_3$ may be used as the dielectric multilayer reflection film.

In addition, instead of using the rear side of n-type GaN substrate 100n to form n electrode 111, n-type GaN layer 102 may be exposed by dry etching from the front surface of the epitaxial to form the n electrode thereon.

The resulting semiconductor laser chip (device) is mounted on a package. When the laser chip is used as a violet (wavelength 380 nm–420 nm) laser with a high output power (at least 30 mW) that is suitable for a high-density recording optical disk, attention should be given to heat dissipation. For example, it is preferable to connect the laser device to the package body by using In soldering material in junction-up manner. Alternatively, the laser may be connected via submount of Si, AlN, diamond, Mo, CuW, BN, Fe, Cu or Au, instead of being directly attached to the package body or heat sink portion. In this way, the nitride semiconductor laser elements and devices are obtained.

The obtained nitride semiconductor laser device exhibits a lower threshold current when it has a stripe width from 1.0 μm to 4.0 μm as shown in FIGS. 9 and 10. The nitride semiconductor laser device exhibits a still lower threshold current when it has a residual film thickness from 0 to 0.3 μm. When the stripe width (W) is 2.0 μm and the residual film thickness (d) is 0.15 μm, the threshold current is significantly low. When $In_{0.05}Ga_{0.95}N_{0.98}P_{0.02}$ well layer/ $In_{0.05}GaN_{0.95}N$ barrier layer is used as the light emitting layer, the obtained patterns are similar to those of FIGS. 9 and 10.

A low temperature AlN buffer layer may be used instead of the low temperature GaN buffer layer 101. Alternatively, the low temperature buffer layer itself may not be formed. However, if the GaN substrate has a poor surface morphology, low temperature GaN buffer layer 101 or low temperature AlN buffer layer is preferably used.

Anti-crack layer 103 may have another In ratio than 0.07. Alternatively the InGaN anti-crack layer itself may not be formed. However, if there is a considerable lattice unconformity between the cladding layer and the GaN substrate, preferably the InGaN anti-crack layer is used.

The light emitting layer has the structure starting from a barrier layer and ending with a barrier layer. Alternatively, it may have the structure starting from a well layer and ending with a well layer. In addition, the number of the layers (the number of the well layers) in the light emitting layer is not limited to three. When ten or less layers are included in the light emitting layer, a low threshold current is available and successive oscillation at room temperature is possible. In particular, this number of the layers is preferably from two to six because this number provides a low threshold current.

The light emitting layer may be formed of an arbitrary combination of the well and barrier layers as shown in Table 1, instead of the combination GaNP well layer/GaN barrier layer.

Although Si (SiH$_4$) is added at $1\times10^{18}$/cm$^3$ to both of the well and barrier layers of the light emitting layer, no impurity may be added thereto. However, when impurities are added to the light emitting layer, a higher emission intensity is achieved. As well as Si, O, C, Ge, Zn and Mg may be used as the impurity to be added to the light emitting layer. Preferably, the amount of the impurity to be added is from approximately $1\times10^{17}$/cm$^3$ to $1\times10^{19}$/cm$^3$. The impurity may be added to both of the well and barrier layers or to one of them only.

Carrier block layer 107 may have the Al ratio other than 0.2. Alternatively, the carrier block layer itself may not be formed. However, the carrier block layer can provide a lower threshold current since the carrier block layer can serve to confine the carriers in the light emitting layer. The Al ratio in the carrier block layer may preferably set higher so that the carriers are strongly confined. The Al ratio may preferably be reduced within a certain range as far as the carrier confinement effect is maintained. In such a case, a greater carrier mobility and a lower electric resistance can be obtained.

The p-type and n-type cladding layers may be made of another 3-element AlGaN crystal with an Al ratio other than 0.1, in place of Al$_{0.1}$Ga$_{0.9}$N crystal. A higher Al ratio provides greater differences between the cladding layers and light emitting layer in terms of energy gap and refractive index, so that the carries and the light can be efficiently confined in the light emitting layer and the lasing threshold current can be decreased. The Al ratio can be reduced within a certain range as far as the carrier/light confinement effect is maintained, so that the carrier mobility in the cladding layers can be increased and the operating voltage of the device can be decreased.

Preferably, the AlGaN cladding layer has a thickness from 0.7 μm to 1.0 μm. The thickness in this range can provide a unimodal vertical transverse mode and enhance light confinement efficiency. In such a case, the optical characteristics of the laser can be improved and the lasing threshold current can be decreased. The cladding layer is not limited to the 3-element AlGaN mixed crystal and may be made of a 4-element mixed crystal such as AlInGaN, AlGaNP, or AlGaNAs. Alternatively, the p-type cladding layer may have a superlattice structure formed of p-type AlGaN layer and p-type GaN layer or superlattice structure formed of p-type AlGaN layer and p-type InGaN layer.

The crystal plane of the main surface of the substrate on which the laser device structure is formed may be A {11-20} plane, R {1-102} plane, M {1-100} plane, or {1-101} plane, as well as C {0001} plane of the GaN substrate. The substrate main surface may make an off angle within 2° with the orientation mentioned above, so that it can have an excellent surface morphology. The surface on which the laser device structure is mounted may be formed of any nitride semiconductor including Al$_x$Ga$_y$In$_z$N ($0 \leq x \leq 1$, $0 \leq y \leq 1$, $0 \leq z \leq 1$, $x+y+z=1$). In the nitride semiconductor laser, in order to obtain a unimodal vertical transverse mode, the layer in contact with the cladding layer should have a lower refractive index than that of the cladding layer. In this regard, an AlGaN substrate is more preferably. In the substrate of Al$_x$Ga$_y$In$_z$N ($0 \leq x \leq 1$, $0 \leq y \leq 1$, $0 \leq z \leq 1$, $x+y+z=1$), 10% or lower of the nitrogen element may be substituted with any of elements As, P and Sb (as far as the hexagonal system is maintained).

At least any one of Si, O, Cl, S, C, Ge, Zn, Cd, Mg and Be may be used for doping the substrate. Of these dopants, Si, O or Cl is particularly preferable for doping an n-type nitride semiconductor substrate.

In general, the nitride semiconductor substrate has a low dislocation density, for example, $10^7$/cm$^2$ or lower. The dislocation density can be represented as etch pit density or threading dislocation density. An advantage in use of the nitride semiconductor substrate is that the nitride semiconductor laser having a high crystallinity with a low threading dislocation density (threading dislocation density is about $1\times10^7$/cm$^2$ or lower) can be manufactured. It should be noted that the light emitting layer containing As, P or Sb could have reduced emission efficiency when the threading dislocation density is high, resulting in an increase in the threshold current. The reason could be that the segregation of As, P or Sb near the threading dislocation lowers the crystallinity of the light emitting layer. The nitride semiconductor substrate can provide an excellent resonator end surface in the cleavage process to make the mirror loss small. In addition, the nitride semiconductor substrate exhibits a good thermal conductivity and an excellent heat dissipation feature. Moreover, the nitride semiconductor substrate will have a thermal expansion coefficient almost equal to that of the nitride semiconductor film deposited on the substrate. Thus, there can occur less warp of the wafer and yield of chips produced by dividing the wafer can be improved. From the reasons described above, the nitride semiconductor substrate is preferably used for the nitride semiconductor laser device.

In place of MOCVD, molecular beam epitaxy (MBE) or hydride vapor phase epitaxy (HVPE) may be used in the above process.

Figure 3:
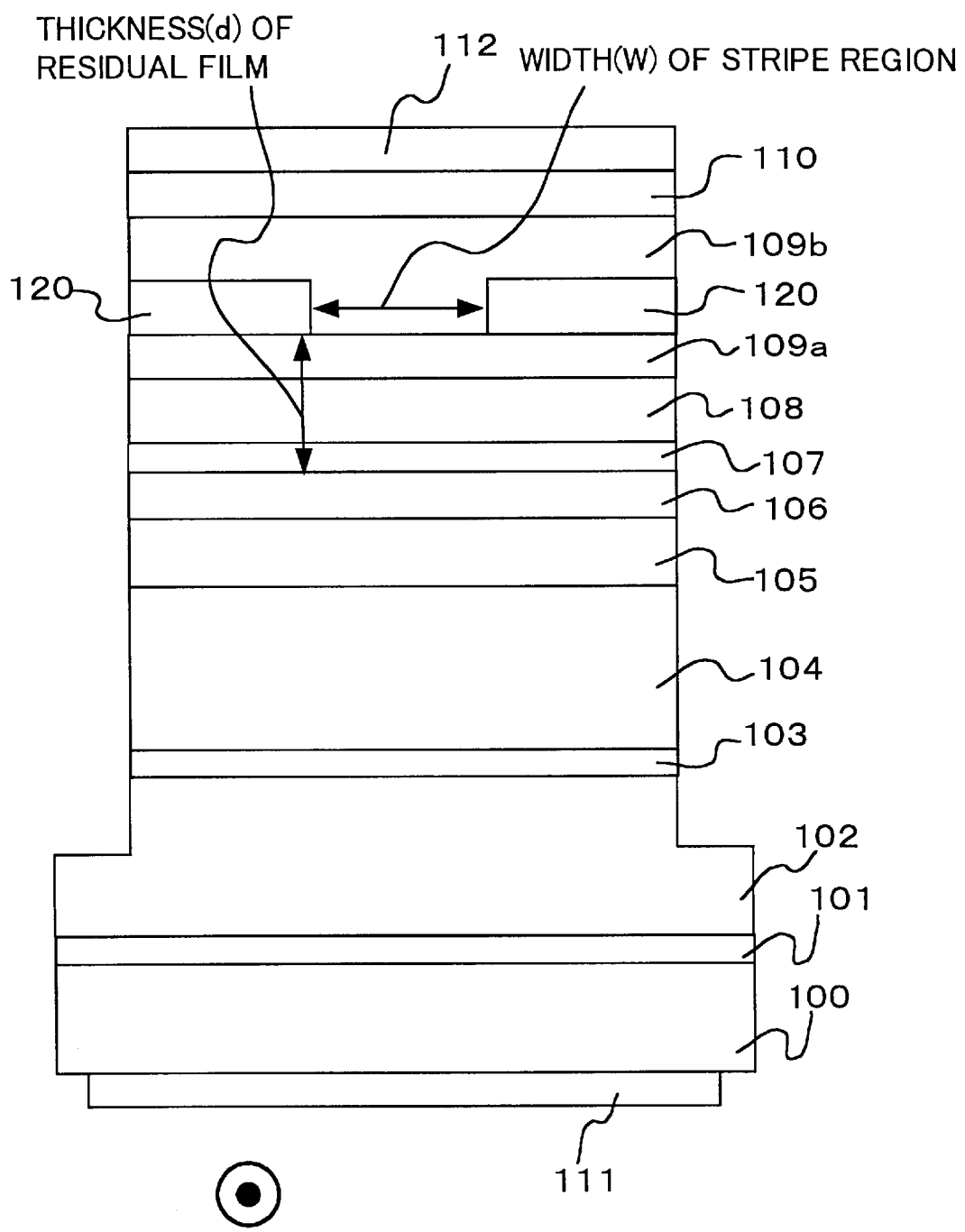
FIG. 3 is a schematic cross section showing one example of the nitride semiconductor laser device having a current blocking layer according to the present invention.

FIG. 3 shows a nitride semiconductor laser device having a current blocking layer that is used to find out appropriate stripe widths and residual film thickness.

Referring to FIG. 3, the nitride semiconductor laser device is composed of a C plane (0001) n-type GaN substrate 100, a low temperature GaN buffer layer 101, an n-type GaN layer 102, an n-type In$_{0.07}$Ga$_{0.93}$N anti-crack layer 103, an n-type Al$_{0.1}$Ga$_{0.9}$N cladding layer 104, an n-type GaN light guiding layer 105, a light emitting layer 106, a p-type Al$_{0.2}$Ga$_{0.8}$N carrier block layer 107, a p-type GaN light guiding layer 108, a p-type Al$_{0.1}$Ga$_{0.9}$N first cladding layer 109a, a current blocking layer 120, a p-type Al$_{0.1}$Ga$_{0.9}$N second cladding layer 109b, a p-type GaN contact layer 110, an n electrode 111, and a p electrode 112.

Current blocking layer 120 is an n-type $Al_{0.25}Ga_{0.75}N$ layer for example. The Al ratio in the current blocking layer may not be 0.25. The laser device is manufactured by a similar process to that described above. The stripe width and residual film thickness are set at various values in preparing different laser device structures. Consequently, the data as shown in FIGS. 9 and 10 are obtained. When a stripe width of 1.5 $\mu$m and a residual film thickness of 0.2 $\mu$m are employed, a lower threshold current is achieved.

Figure 4:
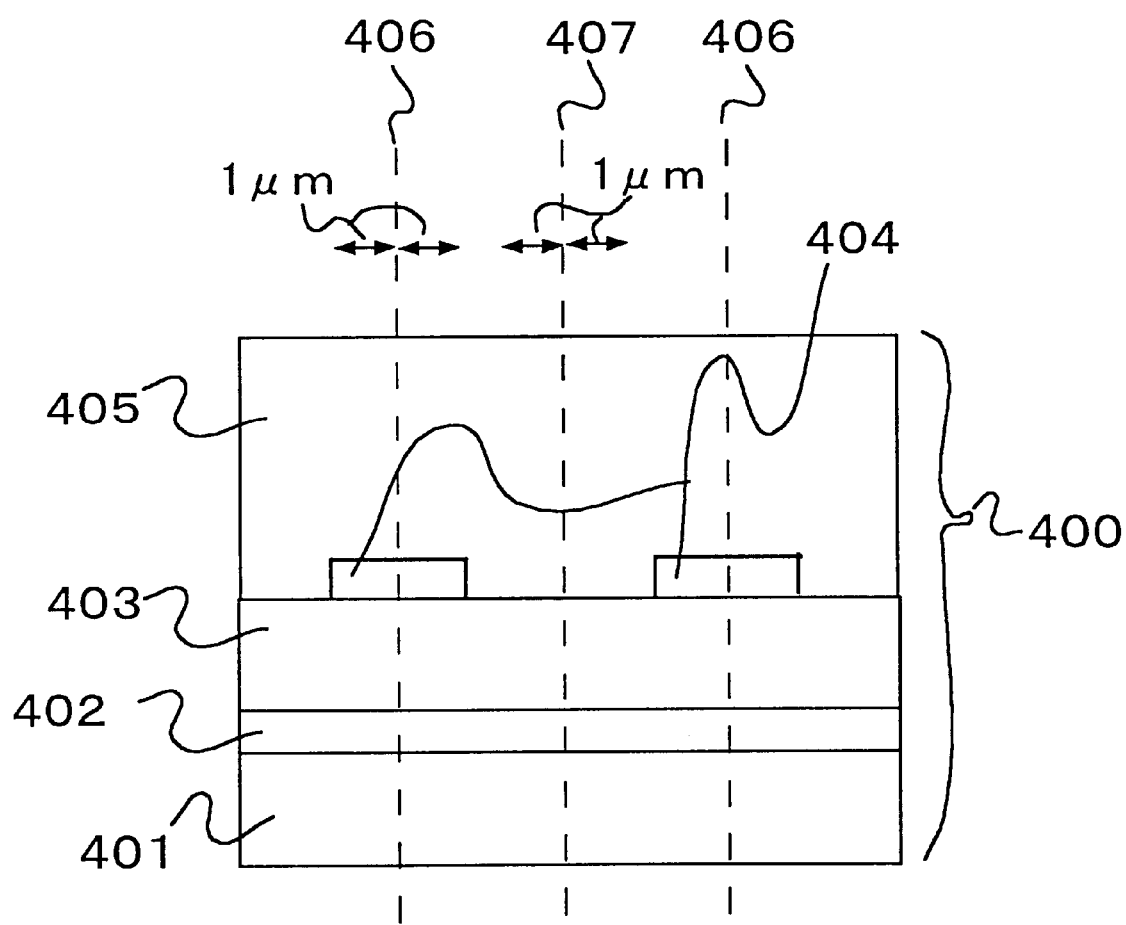
FIG. 4 schematically shows a quasi GaN substrate.
Figure 12:
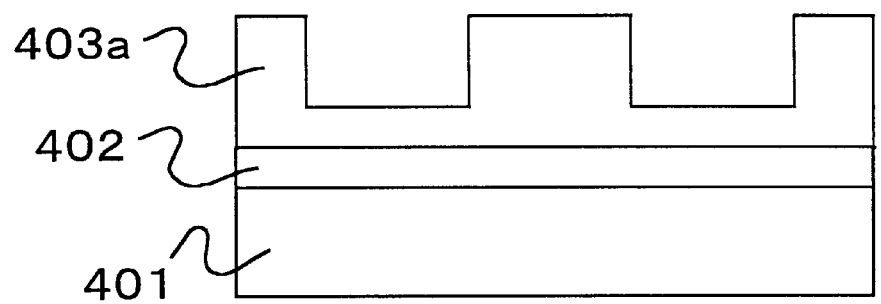
FIGS. 12(a) and 12(b) are each a schematic cross section of another quasi GaN substrate, FIG. 12(a) showing an etching process for fabricating the quasi GaN substrate and FIG. 12(b) showing a completed substrate.
Figure 12:
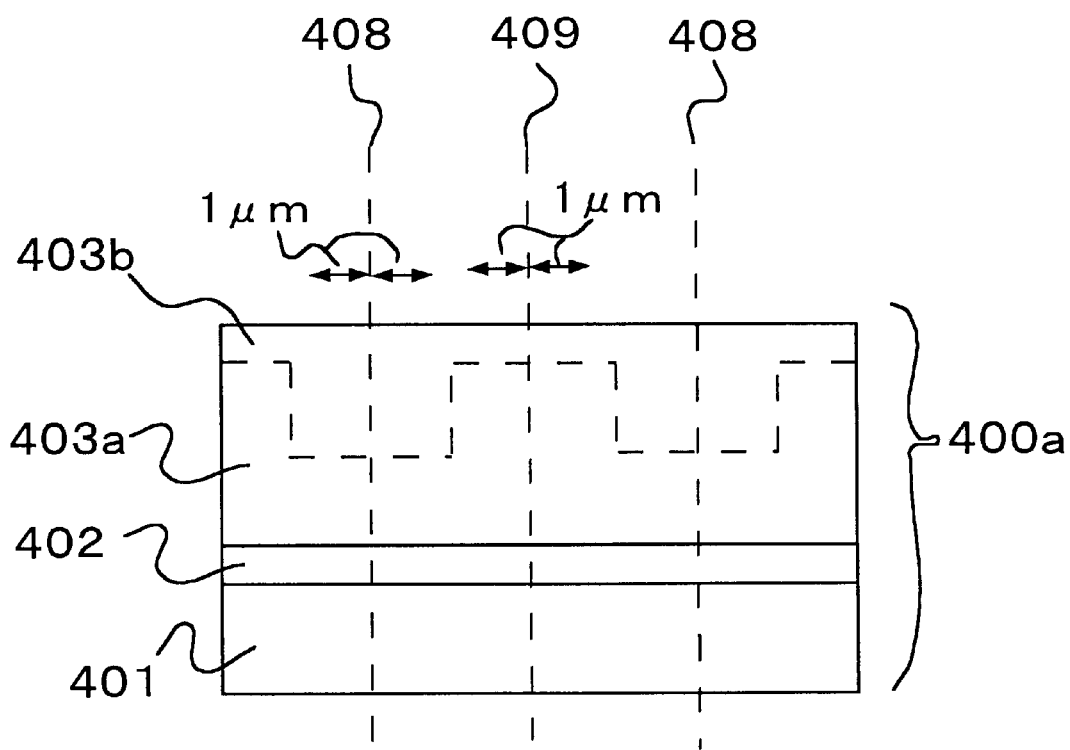

Instead of the nitride semiconductor substrate, another substrate having a nitride semiconductor crystal film with a dislocation density of $10^7/cm^2$ or lower deposited on the crystal material other than the nitride semiconductor crystal may be used. Such a substrate may have a structure as shown in FIG. 4 or FIG. 12. Specifically, GaN substrate 100 shown in FIGS. 1 and 3 may be replaced with a quasi GaN substrate 400 shown in FIG. 4 or a quasi GaN substrate 400a shown in FIG. 12 to produce a semiconductor laser device.

Quasi GaN substrate 400 shown in FIG. 4 is composed of a seed substrate 401, a low temperature buffer layer 402, an n-type GaN film 403, a growth suppression film 404, and n-type GaN thick film 405. Quasi GaN substrate 400 has seed substrate 401 made of any crystal material other than nitride semiconductor. Seed substrate 401 is used as a base for allowing n-type GaN thick film 405 to grow. Growth suppression film 404 is provided for suppressing growth of nitride semiconductor crystal thereon.

Quasi GaN substrate 400a shown in FIG. 12(b) is composed of a seed substrate 401, a low temperature buffer layer 402, a first n-type GaN film 403a, and a second n-type GaN film 403b. FIG. 12(a) shows an intermediate process for fabricating quasi GaN substrate 400a and FIG. 12(b) shows completed quasi GaN substrate 400a. In the process of quasi GaN substrate 400a, low temperature buffer layer 402 is formed on seed substrate 401, then first n-type GaN film 403a is deposited thereon, and thereafter the surface of the GaN film is processed to have a grooved structure by dry etching or wet etching as shown in FIG. 12A. The substrate is then transported again to the crystal growth apparatus to deposit second n-type GaN film 403b, resulting in quasi GaN substrate 400a (FIG. 12). In FIG. 12(a), the groove is formed halfway in the first n-type GaN film. Alternatively, the groove may be made to reach low temperature buffer layer 402 or seed substrate 401.

The uppermost layer of such quasi GaN substrates 400 and 400a, namely the GaN film has a low dislocation density, for example, $10^7/cm^2$ or lower. The dislocation density can be represented as etch pit density or threading dislocation density. The etch pit density can be obtained by immersing a test material such as a substrate in an etching liquid of phosphoric acid: sulfuric acid=1:3 (temperature 250° C.) for ten minutes and measuring pit density formed on the surface of the test material. The threading dislocation density can be measured by a transmission electron microscope.

When a nitride semiconductor film is formed on quasi GaN substrate 400 or 400a, the nitride semiconductor film can have a threading dislocation density of about $3 \times 10^7/cm^2$ or lower in a certain region. This density is lower than that of the film formed on a sapphire substrate or SiC substrate (threading dislocation density of approximately 1 to $10 \times 10^9/cm^2$). The threading dislocation density of the quasi GaN substrate shown in FIG. 4 is higher at a portion 406 directly above the center of the growth suppression film with a certain width and at a portion 407 directly above the center of the portion where no growth suppression film with a certain width is formed. The threading dislocation density of the quasi GaN substrate shown in FIG. 12B is higher at a portion 408 directly above the center of the groove with a certain width and at a portion 409 directly above the center of the portion (hill) where no groove with a certain width is formed. At the portion on or near the middle point between 406 and 407 in FIG. 4 and that between 408 and 409 in FIG. 12B, a lowest threading dislocation density is observed. Since the quasi GaN substrate has different regions with a high threading dislocation density and a low threading dislocation density, the quasi GaN substrate is inferior to the GaN substrate in yield. When a light emitting device is formed on the quasi GaN substrate, the device is advantageously formed in the region where the threading dislocation density is low as described above.

Specifically, seed substrate 401 is made of C plane sapphire, M plane sapphire, A plane sapphire, R plane sapphire, GaAs, ZnO, MgO, spinel, Ge, Si, 6H-SiC, 4H-SiC, 3C-SiC or the like. Specifically, growth suppression film 404 is a dielectric film such as $SiO_2$ film, $SiN_x$ film, $TiO_2$ film or $Al_2O_3$ film, or metal film such as tungsten film. Alternatively, a cavity may be made in the region corresponding to the growth suppression film.

When a conductive SiC substrate or Si substrate is used as the seed substrate, an n electrode may be formed on the rear side of the substrate as shown in FIG. 1. In this case, a high temperature buffer layer should be used instead of low temperature buffer layer 402. Here, the high temperature buffer layer refers to a buffer layer formed at a growth temperature of at least 900° C. The high temperature buffer layer should contain at least Al. It would be impossible to form a nitride semiconductor film with a good crystallinity on the SiC substrate or Si substrate, if the high temperature buffer layer contains no Al. AlN is the most preferable material for the high temperature buffer layer.

The crystal plane constituting the main surface of the seed substrate may be C {0001} plane, A {11-20} plane, R {1-102} plane, M {1-100} plane or {1-101} plane. An excellent surface morphology can be obtained if the substrate main surface makes an off angle within 2° with the orientation mentioned above.

Figure 5:
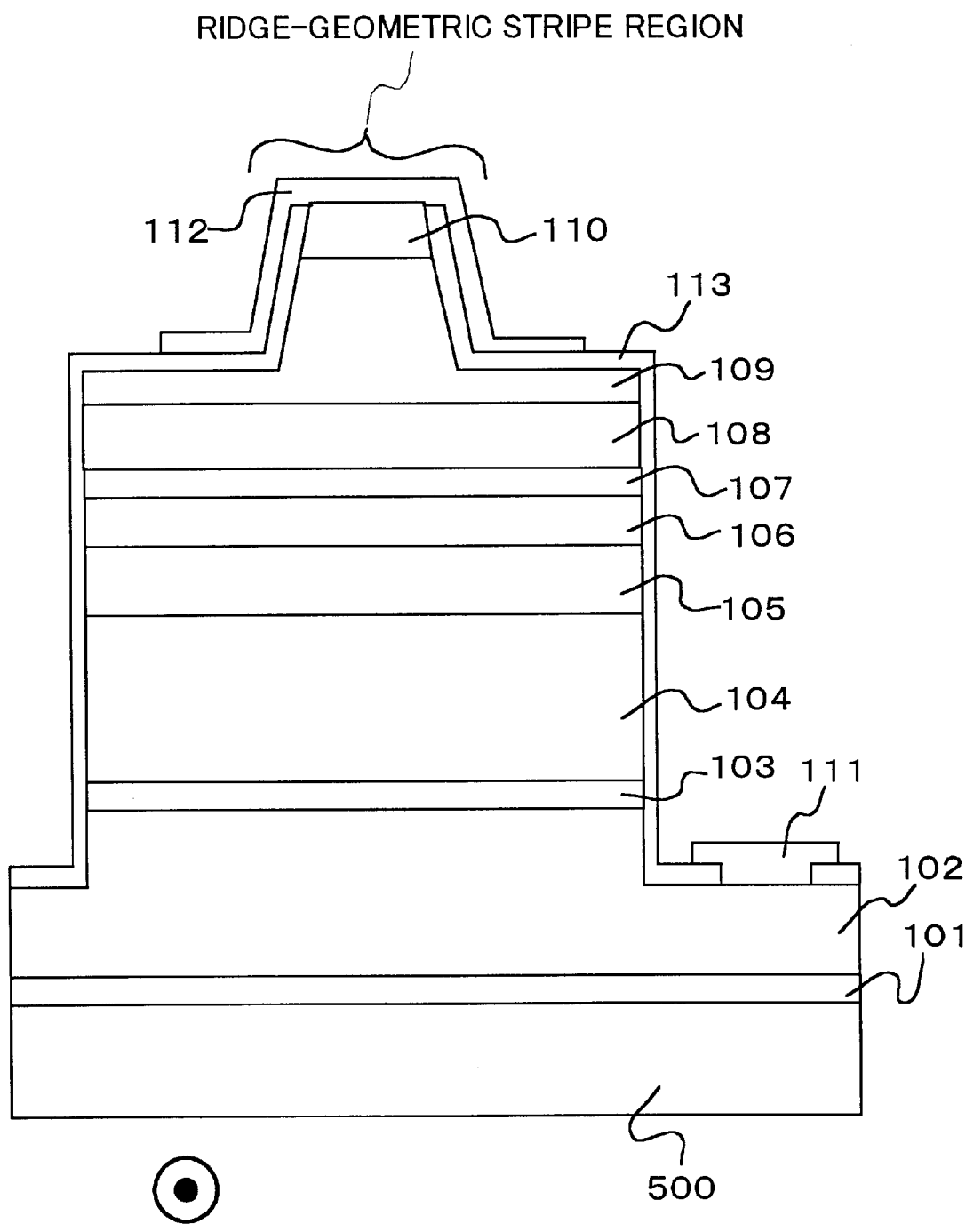
FIG. 5 is a schematic cross section showing another example of the nitride semiconductor laser device having the ridge stripe structure according to the present invention.

FIG. 5 shows a nitride semiconductor laser device using the quasi GaN substrate. The nitride semiconductor laser device shown in FIG. 5 is composed of a substrate 500, a low temperature GaN buffer layer 101, an n-type GaN layer 102, an n-type $In_{0.07}Ga_{0.93}N$ anti-crack layer 103, an n-type $Al_{0.1}Ga_{0.9}N$ cladding layer 104, an n-type GaN light guiding layer 105, a light emitting layer 106, a p-type $Al_{0.2}Ga_{0.8}N$ carrier block layer 107, a p-type GaN light guiding layer 108, a p-type $Al_{0.1}Ga_{0.9}N$ cladding layer 109, a p-type GaN contact layer 110, an n electrode 111, a p electrode 112, and an $SiO_2$ dielectric film 113. Substrate 500 has the structure as that of quasi GaN substrate 400 or 400a. This laser is also manufactured by the method as described above. However, when the seed substrate such as a sapphire substrate has a low thermal conductivity, attention should be given to heat dissipation in packaging the laser device. For example, it is preferable to connect the laser device to the package body by means of In soldering material in junction-down manner. Alternatively, the laser device may be connected via sub mount of Si, AlN, diamond, Mo, CuW, BN, Au, Cu or Fe instead of being directly attached to the package body or heat sink portion. When the substrate other than the nitride semiconductor substrate is made of a high thermal conductivity material such as SiC or Si substrate, the packaging may preferably be done as described above.

When the quasi GaN substrate is used, the laser device is preferably formed in such a manner that the ridge stripe portion does not include at least the parts denoted by 406 and 407 in FIG. 4 or by 408 and 409 in FIG. 12B. More preferably, the ridge stripe portion is formed away from respective central lines of parts 406 and 407 or 408 and 409 by 1 $\mu$m in the lateral direction. This is because the region within 1 $\mu$m from respective central lines of parts 406 and 407 or 408 and 409 in the lateral direction have a relatively high threading dislocation density so that cracks are likely to occur.

Low temperature buffer layer 101 may be low temperature $Al_xGa_{1-x}N$ buffer layer ($0 \leq x \leq 1$). Alternatively, the low temperature buffer layer itself may not be formed. However, if the quasi GaN substrate has a poor surface morphology, low temperature $Al_xGa_{1-x}N$ buffer layer ($0 \leq x \leq 1$) is preferably provided to improve the surface morphology.

Seed substrate 401 may be stripped off from quasi GaN substrate 400 or 400a by a grinding machine and then the obtained material may be used as substrate 500 to fabricate the laser thereon. Alternatively, seed substrate 401 and the under layers from low temperature buffer layer 402 may be all stripped off from quasi substrate 400 or 400a by a grinding machine and then the obtained material may be used as substrate 500 to fabricate the laser thereon. Alternatively, seed substrate 410 and the under layers from growth suppression film 404 may be stripped off from substrate 500 by a grinding machine and then the obtained material may be used as substrate 500 to fabricate the laser thereon. When seed substrate 401 is removed, n electrode 111 can be formed on the rear side of the substrate. Alternatively, seed substrate 401 may be removed after the laser is fabricated.

The nitride semiconductor laser employing such a quasi GaN substrate also exhibits the effects by setting the stripe width and residual film thickness as obtained when the GaN substrate is used.

The nitride semiconductor laser device may also be formed on a nitride semiconductor buffer layer that is formed on a substrate made of any crystal material other than nitride semiconductor. Such a laser device has a structure as shown in FIG. 5. In this case, substrate 500 is C plane sapphire substrate that is a crystal material other than nitride semiconductor. On substrate 500, a low temperature GaN buffer layer 101 (e.g. 25 nm in thickness), an n-type GaN layer 102, an n-type $In_{0.07}Ga_{0.93}N$ anti-crack layer 103, an n type $Al_{0.1}Ga_{0.9}N$ cladding layer 104, an n-type GaN light guiding layer 105, a light emitting layer 106, a p-type $Al_{0.2}Ga_{0.8}N$ block layer 107, a p-type GaN light guiding layer 108, a p-type $Al_{0.1}Ga_{0.9}N$ cladding layer 109, and a p-type GaN contact layer 110 are formed. An n electrode 111 is formed on n-type GaN layer 102, a p electrode 112 is formed on p-type GaN contact layer 110, and these electrodes are insulated by an $SiO_2$ dielectric film 113. This nitride semiconductor laser device is also manufactured by the method as explained above. However, when this nitride semiconductor laser device is used as a violet laser (380 nm to 420 nm in wavelength) with a high power (at least 30 mW) suitable for high density recording optical disk, attention should be given to heat dissipation in the packaging process. This is because the sapphire substrate has a low thermal conductivity. For example, the laser device is preferably connected to the package body by means of In soldering material in junction-down manner. On the other hand, the laser device may be connected via sub-mount of Si, AlN, diamond, Mo, CuW, BN, Au, Cu or Fe instead of being connected directly to the package body or heat sink portion. However, when the substrate other than nitride semiconductor substrate is made of a material with a high thermal conductivity such as SiC substrate or Si substrate, the laser device is preferably packaged by the process as described above.

The nitride semiconductor laser grown on a substrate of a crystal material other than nitride semiconductor (e.g. sapphire substrate, SiC substrate or the like) has a higher threading dislocation density than that grown on the nitride semiconductor substrate or quasi GaN substrate. Such a nitride semiconductor laser has lower emission efficiency and a higher threshold current as compared with those grown on the nitride semiconductor substrate or quasi GaN substrate. On the other hand, such a laser shows a similar relationship between the stripe width and the threshold current; namely the threshold current decreases when the stripe width is from 1.0 $\mu$m to 4.0 $\mu$m. The self oscillation also occurs when the stripe width is 3.5 $\mu$m or smaller. A similar relationship is exhibited between the residual film thickness and the threshold current. More specifically, a nitride semiconductor laser device with a residual film thickness from 0 $\mu$m to 0.5 $\mu$m (from 0.01 $\mu$m to 0.5 $\mu$m for the nitride semiconductor laser device having the current blocking layer) has a lower threshold current. The threshold current itself is higher than that of the laser device former on the nitride semiconductor substrate or quasi GaN substrate.

The laser device formed on the crystal material other than nitride semiconductor has a high threading dislocation density. This may cause low carrier mobility in the p-type layer and allow the spreading current to be wider in the p-type layer, so that the threshold current is relatively low even if the residual film thickness is greater than 0.3 $\mu$m. On the other hand, regardless of the substrate material, the threshold current is low when the stripe width is from 1.0 $\mu$m to 4.0 $\mu$m. A possible reason for this is that the spread of current in the light emitting layer is originally greater than that in the p-type layer and thus an appropriate stripe width is determined by the spread of current in the light emitting layer.

The material for the substrate other than nitride semiconductor may be 6H-SiC, 4H-SiC, 3C-SiC, Si, spinel ($MgAl_2O_4$) or the like as well as the sapphire. The n electrode may be formed on the rear side of the conductive SiC substrate or Si substrate. The buffer layer for allowing a high crystallinity nitride semiconductor film to be grown on the SiC or Si substrate may be similar to that as described above.

The crystal plane forming the main surface of the substrate may not only be C {0001} plane but also be A {11-20} plane, R {1-102} plane, M {1-100} plane, or {1-101} plane. The substrate main surface may preferably make an off angle within 2° with the orientation mentioned above to exhibit an excellent surface morphology.

Figure 6:
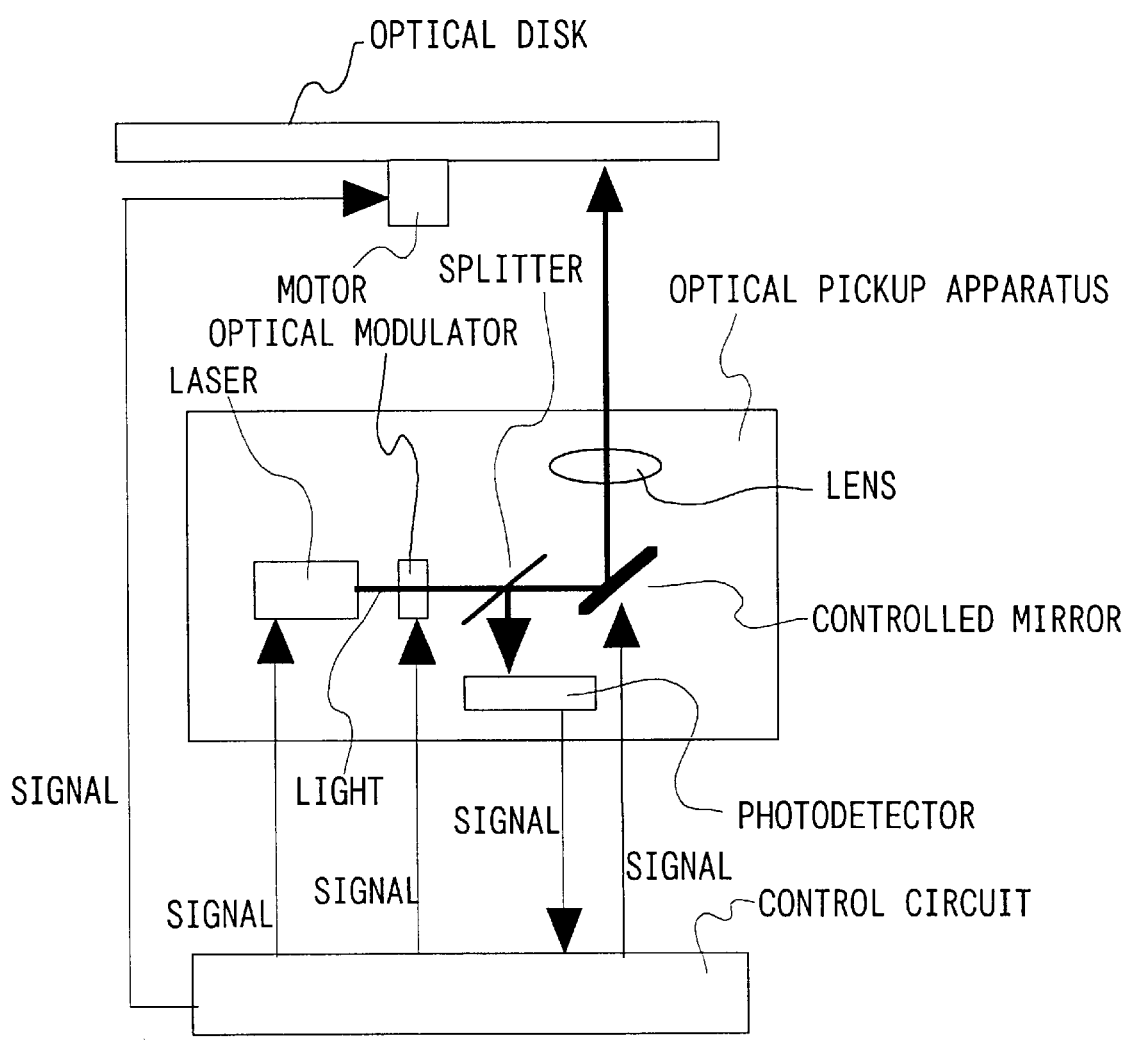
FIG. 6 is a schematic diagram of an optical disk device according to the present invention.

The nitride semiconductor laser according to the present invention heretofore discussed is applied to an optical disk device as shown in FIG. 6. In the optical disk device (any device like DVD having optical pickup) shown in FIG. 6, a laser beam from the nitride semiconductor laser is directed onto an optical dick through an optical modulator, a splitter, a controlled mirror and a lens. The light beam from the splitter is detected by a photodetector. A signal from the photodetector is transmitted to a control circuit. The control circuit supplies control signals to a motor driving the disk, the semiconductor laser, the optical modulator and the controlled mirror respectively. The laser beam is modulated by the optical modulator in response to input information and recorded on the disk through the lens. In reproduction, the laser beam optically converted by pit array on the disk is detected by the photodetector through the splitter and accordingly a reproduction signal is generated. This operation is controlled by the control circuit. The laser output power is usually 30 mW for recording and approximately 5 mW for reproduction.

In addition to the optical disk device above, the laser device according to the present invention may be applied to laser printer, barcode reader, projector with three-primary-color (blue, green, red) lasers and the like.

As heretofore discussed, according to the present invention, the semiconductor laser can have a lower threshold current density and accordingly produce a higher output with a longer lifetime. According to the present invention, a semiconductor laser excellent in noise characteristics can be produced (self oscillation can be achieved for a stripe width of 3.5 µm or smaller). For example, a violet (oscillation wavelength from 360 nm to 420 nm) nitride semiconductor laser according to the present invention can have a lower lasing threshold current density than that of the conventional nitride semiconductor laser using an InGaN light emitting layer. The ratio of light by spontaneous emission relative to the entire laser beam can thus be reduced, which provides a superior noise characteristics. Moreover, the laser device according to the present invention can operate in a stable manner with a high output power (50 mW) in a high temperature ambient and accordingly the laser device is appropriate for an optical disk for high density recording and reproduction. (A shorter oscillation wavelength allows recording and reproduction to be made at a higher density.)

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor laser device, comprising:
    n-type and p-type layers made of nitride semiconductor and formed on a substrate, and
    a light emitting layer provided between said n-type and p-type layers,
    said light emitting layer being formed of a well layer or a combination of well and barrier layers,
    at least the well layer among constituent layers of said light emitting layer being made of nitride semiconductor containing element X, N and Ga, wherein element X is at least one selected from the group consisting of As, P and Sb,
    in said nitride semiconductor containing said element X, N and Ga, element X having an atomic fraction smaller than that of said N,
    a maximum width through which current is to be injected into said light emitting layer via said p-type layer being from 1.0 µm to 4.0 µm,
    said nitride semiconductor laser device has a ridge structure, and
    a distance from a boundary between said light emitting layer and said p-type layer to a bottom of a ridge stripe is approximately 0 µm to 0.3 µm.

2. A nitride semiconductor laser device, comprising:
    n-type and p-type layers made of nitride semiconductor and formed on a substrate, and
    a light emitting layer provided between said n-type and p-type layers,
    said light emitting layer being formed of a well layer or a combination of well and barrier layers,
    at least the well layer among constituent layers of said light emitting layer being made of nitride semiconductor containing element X, N and Ga, wherein element X is at least one selected from the group consisting of As, P and Sb,
    in said nitride semiconductor containing said element X, N and Ga, element X having an atomic fraction smaller than that of said N, and
    a maximum width through which current is to be injected into said light emitting layer via said p-type layer being from 1.0 µm to 3.5 µm,
    said nitride semiconductor laser device having a self oscillation characteristic,
    said nitride semiconductor laser device has a ridge structure, and
    a distance from a boundary between said light emitting layer and said p-type layer to a bottom of a ridge stripe is approxiamately 0 µm to 0.3 µm.

3. A nitride semiconductor laser device, comprising:
    n-type and p-type layers made of nitride semiconductor and formed on a substrate, and
    a light emitting layer provided between said n-type and p-type layers,
    said light emitting layer being formed of a well layer or a combination of well and barrier layers,
    at least the well layer among constituent layers of said light emitting layer being made of nitride semiconductor containing element X, N and Ga, wherein element X is at least one selected from the group consisting of As, P and Sb,
    in said nitride semiconductor containing said element X, N and Ga, element X having an atomic fraction smaller than that of said N,
    a maximum width through which current is to be injected into said light emitting layer via said p-type layer being from 1.0 µm to 4.0 µm,
    said nitride semiconductor laser device includes a current blocking layer for limiting the width through which current is injected into said light emitting layer, and
    a distance from a boundary between said light emitting layer and said p-type layer to said current blocking layer is from 0.01 µm to 0.3 µm.

4. A nitride semiconductor laser device, comprising:
    n-type and p-type layers made of nitride semiconductor and formed on a substrate, and
    a light emitting layer provided between said n-type and p-type layers,
    said light emitting layer being formed of a well layer or a combination of well and barrier layers,
    at least the well layer among constituent layers of said light emitting layer being made of nitride semiconductor containing element X, N and Ga, wherein element X is at least one selected from the group consisting of As, P and Sb,
    in said nitride semiconductor containing said element X, N and Ga, element X having an atomic fraction smaller than that of said N, and
    a maximum width through which current is to be injected into said light emitting layer via said p-type layer being from 1.0 µm to 3.5 µm,
    said nitride semiconductor laser device having a self oscillation characteristic,
    said nitride semiconductor laser device includes a current blocking layer for limiting the width through which current is injected into said light emitting layer, and a distance from a boundary between said light emitting layer and said p-type layer to said current blocking layer is from 0.01 μm to 0.3 μm.

5. The nitride semiconductor laser device according to claim 1, wherein
said substrate is made of nitride semiconductor crystal or has a structure having a nitride semiconductor crystal film with a dislocation density of at most $10^7/cm^2$ grown on a crystal material other than nitride semiconductor crystal.

6. The nitride semiconductor laser device according to claim 2, wherein
said substrate is made of nitride semiconductor crystal or has a structure having a nitride semiconductor crystal film with a dislocation density of at most $10^7/cm^2$ grown on a crystal material other than nitride semiconductor crystal.

7. An optical device using the nitride semiconductor laser device according to claim 1.

8. An optical device using the nitride semiconductor laser device according to claim 2.

9. The nitride semiconductor laser device according to claim 3, wherein
said substrate is made of nitride semiconductor crystal or has a structure having a nitride semiconductor crystal film with a dislocation density of at most $10^7/cm^2$ grown on a crystal material other than nitride semiconductor crystal.

10. The nitride semiconductor laser device according to claim 4, wherein
said substrate is made of nitride semiconductor crystal or has a structure having a nitride semiconductor crystal film with a dislocation density of at most $10^7/cm^2$ grown on a crystal material other than nitride semiconductor crystal.

11. An optical device using the nitride semiconductor laser device according to claim 3.

12. An optical device using the nitride semiconductor laser device according to claim 4.

* * * * *